(12) United States Patent
Hatayama et al.

(10) Patent No.: US 9,006,747 B2
(45) Date of Patent: Apr. 14, 2015

(54) SIC SEMICONDUCTOR ELEMENT AND MANUFACTURING METHOD THEREOF

(75) Inventors: Tomoaki Hatayama, Nara (JP); Hidenori Koketsu, Nara (JP); Yoshihiro Todokoro, Nara (JP)

(73) Assignee: National University Corporation Nara Institute of Science and Technology, Nara (JP)

( * ) Notice: Subject to any disclaimer, the term of this patent is extended or adjusted under 35 U.S.C. 154(b) by 0 days.

(21) Appl. No.: 14/240,719

(22) PCT Filed: Aug. 27, 2012

(86) PCT No.: PCT/JP2012/005363
§ 371 (c)(1),
(2), (4) Date: Feb. 25, 2014

(87) PCT Pub. No.: WO2013/031172
PCT Pub. Date: Mar. 7, 2013

(65) Prior Publication Data
US 2014/0203300 A1    Jul. 24, 2014

(30) Foreign Application Priority Data
Aug. 26, 2011    (JP) .................................. 2011-185326

(51) Int. Cl.
| | | |
|---|---|---|
| H01L 29/15 | (2006.01) | |
| H01L 21/306 | (2006.01) | |
| H01L 29/04 | (2006.01) | |
| H01L 29/16 | (2006.01) | |
| H01L 21/3065 | (2006.01) | |

(Continued)

(52) U.S. Cl.
CPC ........ *H01L 21/30604* (2013.01); *H01L 29/045* (2013.01); *H01L 29/1608* (2013.01); *H01L 21/3065* (2013.01); *H01L 29/4236* (2013.01); *H01L 29/4238* (2013.01); *H01L 29/66068* (2013.01); *H01L 29/7813* (2013.01); *H01L 21/0475* (2013.01); *H01L 29/1037* (2013.01); *H01L 21/30617* (2013.01); *H01L 21/3081* (2013.01); *H01L 21/3083* (2013.01)

(58) Field of Classification Search
USPC ............................................ 257/77; 438/105
See application file for complete search history.

(56) References Cited

U.S. PATENT DOCUMENTS

| | | | |
|---|---|---|---|
| 8,546,815 B2 | 10/2013 | Yano et al. | |
| 2004/0051136 A1 | 3/2004 | Kataoka et al. | |
| 2009/0146154 A1* | 6/2009 | Zhang et al. | ..................... 257/77 |
| 2011/0017998 A1* | 1/2011 | Nakano et al. | ................... 257/66 |
| 2011/0068347 A1* | 3/2011 | Strittmatter | ..................... 257/76 |
| 2011/0175711 A1 | 7/2011 | Harada et al. | |
| 2013/0023113 A1 | 1/2013 | Masuda et al. | |
| 2013/0126904 A1 | 5/2013 | Masuda et al. | |

(Continued)

FOREIGN PATENT DOCUMENTS

JP    2009-187966 A    8/2009

*Primary Examiner* — Douglas Menz
(74) *Attorney, Agent, or Firm* — Ogilvie Law Firm

(57) ABSTRACT

Provided are a technology that simply forms a particular crystal surface such as a {03-38} surface having high carrier mobility in trench sidewalls and a SiC semiconductor element where most of the trench sidewalls appropriate for a channel member are formed from {03-38} surfaces. A trench structure formed in a (0001) surface or an off-oriented surface of a (0001) surface with an offset angle 8° or lower of SiC is provided. The channel member is in the trench structure. At least 90% of the area of the channel member is a {03-38} surface or a surface that a {03-38} surface offset by an angle from −8° to 8° in the <1-100> direction. Specifically, the trench sidewalls are finished to {03-38} surfaces by applying a thermal etching to a trench with (0001) surfaces of SiC. Thermal etching is conducted in a chlorine atmosphere above 800° C. with nitrogen gas as the carrier.

21 Claims, 22 Drawing Sheets

| (51) | Int. Cl. | |
|---|---|---|
| | H01L 29/423 | (2006.01) |
| | H01L 29/66 | (2006.01) |
| | H01L 29/78 | (2006.01) |
| | H01L 21/04 | (2006.01) |
| | H01L 29/10 | (2006.01) |
| | H01L 21/308 | (2006.01) |

(56) References Cited

U.S. PATENT DOCUMENTS

| | | |
|---|---|---|
| 2013/0130482 A1 | 5/2013 | Masuda et al. |
| 2013/0183820 A1 | 7/2013 | Hiyoshi et al. |
| 2013/0285069 A1 | 10/2013 | Yano et al. |

* cited by examiner

→ a portion with a current flow (1) before etching    (2) after etching (1) before etching    (2) after etching

SIC SEMICONDUCTOR ELEMENT AND MANUFACTURING METHOD THEREOF

TECHNICAL FIELD

The present invention relates to a technique with which a specific crystal plane with high channel mobility can be selectively formed on trench sidewalls of an SiC semiconductor device such as a MOS type field effect transistor.

BACKGROUND ART

An SiC semiconductor is a semiconductor made of SiC (silicon carbide) being a compound of carbon (C) and silicon (Si). The greatest feature of the SiC semiconductor is its physical properties suitable as a material of a semiconductor device (power device) to be used for power electronics. For example, in the case of 4H-SiC being commercially-available single crystal, the bandgap is 3.26 eV that is three times as wide as that of an Si semiconductor, the dielectric breakdown electric field strength is 2.8 MV/cm that is 10 times as high as that of an Si semiconductor, and the thermal conductivity is 4.9 W/cm that is three times as high as that of an Si semiconductor.

The SiC semiconductor is thermally and radiologically more stable than an Si semiconductor, and is excellent in terms of heat resistance, chemical resistance, and radiation resistance.

From these features, a MOS type field effect transistor (MOSFET) or a shot key barrier diode (SBD) made of an SiC semiconductor is preferably used for a power device to be used for power electronics, and an SiC semiconductor can be reduced in energy loss as compared with an Si semiconductor, so that this is considered to be important as a measure for energy saving.

However, in the MOSFET made of SiC, it has been conventionally regarded as a problem that there are a lot of defects in the interface between the gate insulating film (gate oxide film) and SiC, which makes the carrier mobility of the SiC small. With regard to this problem, an improvement in carrier mobility by reducing interface defects by devising the method for forming the gate insulating film by thermal oxidation method, CVD method, or interface nitridation method, etc., has been studied.

On the other hand, regarding the above-described problem, there is a technique for improving the carrier mobility by focusing on the crystal plane of SiC. In hexagonal SiC, an improvement in channel mobility by using a {03-38} plane which is known as a crystal plane with high carrier mobility as the interface between the gate insulating film and SiC is one of such methods.

Here, the {03-38} plane is a crystal plane tilted at 54.7 degrees in a <1-100> direction from a {0001} plane (refer to FIG. 1). The {03-38} plane of SiC corresponds to the {100} plane of Si, and is expected to have low interface state density and high carrier mobility.

However, conventionally, there has been a problem in which substrate formation using the {03-38} plane of SiC is difficult. The {03-38} plane can be cut only from a SiC single crystal mass, and if wafers with the {03-38} planes are obtained by cutting from a single crystal mass for circular wafers with the {0001} planes, the cut wafers are oval and the number of wafers to be obtained is limited (refer to FIG. 2).

In particular, it was very difficult to form the {03-38} plane on a trench sidewall in a vertical type device structure like a trench type MOSFET, etc.

As a technique for forming the {03-38} plane on trench sidewalls, for example, a technique with which trench sidewalls are formed into the {03-38} planes by forming a trench perpendicularly on a substrate using a {11-20} plane by plasma etching has already been known (Patent Document 1). With the technique disclosed in Patent Document 1, trench sidewalls are formed into the {03-38} planes by forming a trench perpendicularly on a substrate using the {11-20} plane by plasma etching (refer to FIG. 3), and the substrate surface is etched by approximately several nm to 0.1 μm by supplying hydrogen, etc., inside a reaction furnace under reduced pressure at 1500° C. or higher. Accordingly, a damaged layer after plasma etching for forming the trench is removed.

However, the technique disclosed in Patent Document 1 described above is disadvantageous in that the {11-20} plane itself to be used as a substrate is not commercially available and is difficult to obtain.

On the other hand, a technique with which uneven sub-trenches are intentionally formed on the bottom surface of a trench formed on a semiconductor substrate not by plasma etching but by dry etching treatment in a mixed atmosphere of chlorine and oxygen is known (Patent Document 2). According to the technique of Patent Document 1, by forming uneven sub-trenches on the trench bottom surface (refer to FIG. 4), a uniform CVD oxide film is formed inside the trench to improve the inter-element breakdown voltage.

[Patent Document 1] JPA-2006-351744
[Patent Document 2] JPA-2008-258265

OUTLINE OF THE INVENTION

Problems to be Solved by the Invention

As described above, conventionally, substrate formation using the {03-38} plane or {03-3-8} plane of SiC was difficult. In particular, it was difficult to manufacture a MOSFET that used the {0001} plane or {000-1} plane being a basal plane of SiC as an electrode, includes the {03-38} planes or {03-3-8} planes formed on trench sidewalls, and uses the {03-38} planes or {03-3-8} planes as channel portions in the vertical type device structure like a trench type MOSFET.

In view of the above-described circumstances, an object of the present invention is to provide a technique for easily forming a specific crystal plane such as the {03-38} plane and the {03-3-8} plane with high carrier mobility on a trench sidewall from the {0001} plane or the {000-1} plane being a basal plane of SiC, and an SiC semiconductor device in which most of the trench sidewalls corresponding to channel portions are formed of the {03-38} planes or the {03-3-8} planes, etc.

It is noted that crystal planes and directions, which are crystallographically expressed in numeric characters with a bar overhead, will be expressed in numeric characters with a minus sign (−) placed in front, instead of placing a bar overhead, due to limitations of description in the specification, abstract, and claims of the present invention. It is also noted that [ ] will be used to express an individual direction indicating an intracrystalline direction, < > will be used to express a collective direction indicating all equivalent directions, ( ) will be used to express an individual plane indicating a crystal plane, and { } will be used to express a collective plane having equivalent symmetry. It is further noted that in the accompanying drawings, crystal planes and directions will be in the original crystallographic expression, that is, expressed in numeric characters with a bar overhead.

Means to Solve the Objects

The inventors of the present invention successfully processed a crystal plane of a trench sidewall of SiC easily into a specific crystal plane with high carrier mobility by using anisotropy of the crystal plane of SiC obtained by thermal etching, and completed the present invention. Hereinafter, the present invention is described.

In this specification, sidewalls of grooves (including both of trenches and mesas) are collectively referred to as trench sidewalls.

An SiC semiconductor device according to the present invention uses surfaces of trench sidewalls as channel portions, where the trench sidewalls are formed from a basal plane of SiC having a crystal structure of any of a hexagonal crystal, a cubical crystal, and a rhombohedral crystal or formed from an off plane having an off angle of 8 degrees or less with respect to the basal plane, and 50% or more of the area of the trench sidewall is a plane tilted at 54 to 55 degrees from the basal plane.

For example, when SiC has a crystal structure of a hexagonal crystal, the basal plane is a (0001) plane, and the trench sidewalls are formed from the (0001) plane or formed from an off-angle plane having an off angle of 8 degrees or less with respect to the (0001) plane.

The trench sidewall is used as a channel portion. The surface of the trench sidewall is a {03-38} plane or a plane having an off angle of −8 to 8 degrees in a <1-100> direction with respect to the {03-38} plane.

As described above, it has been conventionally known that the {03-38} plane had properties of low interface state density and high carrier mobility. However, in actuality, substrate formation using the {03-38} plane was difficult, and processing to form the {03-38} plane on a trench sidewall was also difficult. Due to this problem in processing, it was very difficult to form trench sidewalls by using the {03-38} planes being specific crystal planes having properties of high carrier mobility. This time, as shown in the embodiments described later, an SiC semiconductor device that had a trench structure formed on the (0001) Si face of SiC and included sidewall portions of trench sidewalls 50% or more of the area of which corresponding to channel portions was formed of the {03-38} plane was in actuality successfully manufactured. In the embodiments described later, this technique is disclosed in detail along with scanning electron microscopic (SEM) images.

Here, the (0001) plane of SiC is a so-called silicon face (Si face) of an SiC crystal. The off plane having an off angle with respect to the (0001) plane is a plane with a tilt angle (off angle) of, for example, 2 degrees, 4 degrees, 6 degrees, or 8 degrees, etc., in a predetermined direction with respect to the (0001) plane. The tilt angle is preferably larger than 0 degrees and equal to or smaller than 8 degrees. The predetermined direction is, for example, a <11-20> direction, etc. The predetermined direction and tilt angle can be appropriately selected according to properties of the device to be manufactured. In the present invention, the (0001) plane and the off plane having an off angle with respect to the (0001) plane can be handled equally when forming the trench structure.

Here, having a trench structure formed on the (0001) plane of SiC means that the (0001) Si face of SiC is used as a substrate and a trench is formed on the substrate. Having a trench structure formed on an off plane having an off angle of 8 degrees or less with respect to the (0001) plane means that a plane tilted at an off angle more than 0 degrees and 8 degrees or less in a predetermined direction with respect to the (0001) Si face of SiC is used as a substrate, and a trench is formed on the substrate.

The shape of the trench is not especially limited, and the trench includes a trench having trench sidewalls formed perpendicular to the substrate, a tapered trench, a trench with a flat trench bottom portion or formed with sub-trenches, and a trench in a V shape in section, etc.

The channel portion of the semiconductor device according to the present invention is provided on a portion or the whole of the trench sidewall portion of the trench structure. 50% or more of the area of the trench sidewall is the {03-38} plane or a plane having an off angle of −8 degrees to 8 degrees in the <1-100> direction with respect to the {03-38} plane. By forming most of the surfaces of the channel portions into predetermined planes, a semiconductor device with high carrier mobility can be obtained.

Here, the plane having an off angle of −8 degrees to 8 degrees in the <1-100> direction with respect to the {03-38} plane is a plane in a range with properties equivalent to the properties of the {03-38} plane.

By applying heat treatment to the trench structure formed on the above-described (0001) plane or the off plane having an off angle of 8 degrees or less with respect to the (0001) plane, the surface of the channel portion can be formed.

In the present invention, by a processing method using heat treatment described later, the {03-38} plane can be formed on most of the trench sidewalls corresponding to the channel portions, however, at a convex portion at which the trench sidewalls being different crystal planes of the {03-38} planes are adjacent, a plane different from the {03-38} plane is inevitably partially formed by etching. Therefore, the proportion of the trench sidewall formed into the {03-38} plane is not always 100%, so that 50% or more or 90% or more of the area of the channel portion is the {03-38} plane, etc.

Next, application of heat treatment to the trench on the (0001) plane of SiC is described. Heat treatment is heating treatment using a halogen-based gas, etc., and is an etching method using chemical reaction. As a mask member, a silicon oxide film is used. No vacuum process is used, so that etching can be performed with a simple device.

The inventors of the present invention stably formed the {03-38} plane being a specific crystal plane on trench sidewalls with high reproducibility by using this heat treatment (hereinafter, referred to as thermal etching treatment).

Here, thermal etching treatment is etching at a predetermined temperature under an atmospheric pressure or reduced pressure in a halogen-based gas atmosphere by using an inert gas including nitrogen or a noble gas or hydrogen gas as a carrier gas. The halogen-based gas is one or two or more kinds of gases selected among $F_2$, $Cl_2$, $Br_2$, HF, $ClF_3$, $SiF_4$, $BrF_3$, $BrF_6$, $WF_6$, $TiF_4$, $BF_3$, $MoF_6$, HCl, and $SiCl_4$.

Preferably, etching is performed at 800° C. or higher, more preferably, 900° C. to 1000° C. in a chlorine atmosphere by using an inert gas such as nitrogen gas or a hydrogen gas as a carrier gas. Etching may be performed in a mixed atmosphere by mixing a chlorine gas with an oxygen gas. In the case of the mixed atmosphere of a chlorine gas and an oxygen gas, the etching speed changes depending on the oxygen mix proportion. It is better that the mix proportions of the chlorine gas and the oxygen gas are adjusted so as to be equal to each other or the oxygen gas mix proportion becomes larger when performing etching. As the oxygen gas proportion is made larger, carbon formed through reaction of chlorine and SiC can be swiftly removed by the oxygen gas and the etching speed can be increased.

Etching may be performed at 400° C. or higher in a fluorine atmosphere by using an inert gas or a hydrogen gas as a carrier gas.

The thermal etching treatment may use molten salt as a treatment agent. Molten salt is obtained by liquefying a solid of an ion crystal of salt or oxide by melting the solid by heating to a high temperature. As molten salt, KOH is preferably used since its treatment temperature and risk are comparatively low. Generally, in thermal etching treatment using KOH, wet etching in which KOH is put in a crucible of nickel or platinum and immersed to be processed therein is used.

Next, the trench structure in the SiC semiconductor device according to the present invention is described.

The trench structure in the SiC semiconductor device according to the present invention preferably has a shape of any of an inverted hexagonal truncated pyramid, an inverted equilateral triangular truncated pyramid, an inverted hexagonal pyramid, and an inverted equilateral triangular pyramid all inner angles of which are 120 degrees. Trench sidewalls on all three or six surfaces can easily be processed into the {03-38} planes. When the trench structure has a plurality of trenches which have an inverted equilateral hexagonal truncated pyramid shape or an inverted equilateral hexagonal pyramid shape, a honeycomb structure can be formed.

The trench structure may have a shape of either of an inverted quadrangular truncated pyramid or an inverted quadrangular pyramid of a parallelogram or a rhombus with inner angles of 60 degrees and 120 degrees. Trench sidewalls on all four surfaces can easily be processed into the {03-38} planes.

When the trench bottom portions are trenched at acute angles like an inverted hexagonal pyramid, an inverted quadrangular pyramid, or an inverted equilateral triangular pyramid, it is advantageous that the cell pitch can be made small, however, concentration of electric field occurs at the trench bottom portion, so that a measure for relaxing this (for example, insertion of a layer with a changed impurity concentration) is required. On the other hand, when the trench bottom portion is flat like an inverted hexagonal truncated pyramid, an inverted quadrangular truncated pyramid, and an inverted equilateral triangular truncated pyramid, concentration of electric field hardly occurs at the trench bottom portion, so that a measure for relaxing the concentration of electric field is not necessary, however, the cell pitch becomes larger than in a pyramid.

The trench structure in the SiC semiconductor device according to the present invention is preferably formed to extend in the horizontal direction of the (0001) plane or an off plane having an off angle of 8 degrees or less with respect to the (0001) plane, each of sidewalls on both sides is formed of at least two kinds of different crystal planes selected from the {03-38} planes, and the upper edges of the trench sidewalls adjacent to each other are continuously formed so that the inner angle between the upper edges is any of 60 degrees, 120 degrees, 240 degrees, and 300 degrees. Almost all of the trench sidewalls can easily be processed into the {03-38} planes.

Next, another SiC semiconductor device according to the present invention is described.

In another SiC semiconductor device according to the present invention, SiC has a hexagonal crystal structure, the basal plane is the (000-1) plane, and a trench sidewall formed from the (000-1) plane or a trench sidewall formed from an off-angle plane having an off angle of 8 degrees or less with respect to the (0001) plane is used as a channel portion. The surface of the trench sidewall is a plane having an off angle of −8 to 8 degrees in the <1-100> direction with respect to the {03-3-8} plane or {03-3-8} plane.

It has been conventionally known that the {03-3-8} plane has properties of low interface state density and high carrier mobility like the {03-38} plane. However, in actuality, substrate formation using the {03-3-8} plane is difficult, and processing to form the {03-3-8} plane on a trench sidewall was also difficult. From this problem in processing, it was very difficult to form a trench sidewall by using the {03-3-8} plane being a specific crystal plane having high carrier mobility. This time, as shown in the embodiments described later, an SiC semiconductor device having a trench structure formed on the (000-1) C face of SiC and almost all trench sidewalls are formed of the {03-3-8} planes was in actuality successfully manufactured. In the embodiments described later, this technique is disclosed along with SEM images.

Description of the trench to be formed from the (000-1) plane of SiC, description of a trench sidewall portion 50% or more or 90% or more of the area of which is formed of the {03-3-8} plane, etc., of SiC, description of detailed heat treatment (thermal etching treatment), and description of a preferred trench structure overlap the descriptions given above, therefore, these descriptions are omitted.

The SiC semiconductor device according to the present invention has crystal planes with high carrier mobility on most of the trench sidewalls corresponding to channel portions, so that the SiC semiconductor device can be preferably used for a MOSFET of a trench type MOS gate structure. By using a silicon oxide film provided on a trench sidewall as a gate insulating film, the channel mobility of MOSFET, etc., can be improved, and on-resistance of the transistor can be reduced.

Next, a method for manufacturing an SiC semiconductor device according to the present invention is described. The method for manufacturing the SiC semiconductor device according to the present invention includes at least the following steps 1) and 2).

1) A step of forming a trench structure in advance from a basal plane of SiC having a crystal structure of any of a hexagonal crystal, a cubical crystal, and a rhombohedral crystal or from an off plane having an off angle of 8 degrees or less with respect to the basal plane.

2) A step of forming trench sidewalls forming channel portions into planes tilted at 54 to 55 degrees from the basal plane by applying heat treatment to the trench.

For example, when SiC is a hexagonal crystal and the basal plane is the (0001) plane, a trench structure is formed in advance from the (0001) plane of SiC or an off plane having an off angle of 8 degrees or less with respect to the (0001) plane, and then, heat treatment is applied to the trench to form trench sidewalls forming channel portions into {03-38} planes or off planes having an off angle of −8 to 8 degrees in the <1-100> direction with respect to the {03-38} planes.

Forming the trench structure in advance from the basal plane of SiC or an off plane having an off angle of 8 degrees or less with respect to the basal plane in the step 1) described above means that, for example, the (0001) plane of SiC, etc., is used as a substrate, a pattern is formed on the substrate with an oxide film, and a trench is formed on the substrate by etching by using the formed oxide film as a mask. Plasma etching may also be used to form a trench on the substrate.

Forming a trench structure from the (0001) plane of SiC means that the (0001) Si face of SiC is used as a substrate, and a trench is formed on the substrate. Forming a trench structure from an off plane having an off angle of 8 degrees or less with respect to the (0001) plane means that a plane tilted at an off angle of 0 degrees or more and 8 degrees or less in a predetermined direction with respect to the (0001) Si face of SiC is used as a substrate, and a trench is formed on the substrate. The shape of the trench is not especially limited, and the trench includes a trench having trench sidewalls formed perpendicular to the substrate, a tapered trench, a trench with a flat trench bottom portion or formed with sub-trenches, and a trench in a V shape in section, etc.

As heat treatment (hereinafter, referred to as "thermal etching treatment") in the step 2) described above, by using an inert gas including nitrogen or a noble gas or a hydrogen gas as a carrier gas, etching is performed at a predetermined temperature under an atmospheric pressure or reduced pressure in a halogen-based gas atmosphere. Preferably, etching is performed at 800° C. or higher, more preferably, 900° C. to 1000° C. in a chlorine atmosphere by using an inert gas such as nitrogen gas or a hydrogen gas as a carrier gas. Etching may be performed in a mixed atmosphere by mixing a chlorine gas with an oxygen gas. Etching may be performed at 400° C. or higher in a fluorine atmosphere by using an inert gas or a hydrogen gas as a carrier gas. The thermal etching treatment may use molten salt as a treatment agent.

In another method for manufacturing an SiC semiconductor device according to the present invention, a trench structure is formed in advance from the (000-1) plane of SiC or an off plane having an off angle of 8 degrees or less with respect to the (000-1) plane, and then, heat treatment is applied to the trench to form trench sidewalls forming channel portions into the {03-3-8} planes or off planes having an off angle of −8 to 8 degrees in the <1-100> direction with respect to the {03-3-8} planes.

Description of the heat treatment (thermal etching treatment) and description of the shape of the trench overlap the description given above of the method for manufacturing an SiC semiconductor device according to the present invention, therefore, these descriptions are omitted.

The crystal structure of the SiC semiconductor device is acceptable as long as it has a hexagonal crystal structure, and for example, 4H-SiC, 6H-SiC, and 15R-SiC (rhombohedral crystal), etc., can be used.

Effects of the Invention

According to the present invention, a specific crystal plane such as the {03-38} plane and {03-3-8} plane with high carrier mobility can easily be formed on a trench sidewall from the {0001} plane or {0001-1} plane being a basal plane of SiC. By manufacturing a power MOSFET by using an SiC semiconductor device in which most of the trench sidewalls corresponding to channel portions are formed of the {03-38} planes or {03-3-8} planes, etc., on-resistance can be reduced, and a reduction in power consumption of the power device can be expected.

By further reducing defects in the interface between the insulating film and SiC by combining known techniques with the specific crystal planes such as the {03-38} plane and {03-3-8} plane according to the present invention, device properties can further be improved.

BEST MODE FOR CARRYING OUT THE INVENTION

Embodiments of the present invention will be described in detail below with reference to the drawings. The present invention is not limited to the following embodiment and examples of shown in the figure, and the present invention can be variously changed in design.

Embodiment 1

In the first embodiment, a state where a trench is formed in advance on the (0001) plane of 4H-SiC by plasma etching, and thereafter, as a result of thermal etching treatment in a halogen-based gas atmosphere, the {03-38} planes are obtained on trench sidewalls is described in detail.

As a sample of the first embodiment, a plane having an off angle of 4 degrees with respect to the 4H-SiC plane was used. This is a substrate having an off angle of 4 degrees in the <11-20> direction from the (0001) plane. An oxide film to be used as a mask for thermal etching was made, and on this oxide film, an Al mask pattern (with a thickness of approximately 0.1 μm) for plasma etching (Inductive Coupled Plasma-Reactive Ion Etching) was formed by photolithography and lifting-off. Based on the Al pattern, the oxide film and SiC were plasma-etched to form a trench on the (0001) plane of 4H-SiC. It is known that when forming a trench by this method, sub-trenches are easily formed on the periphery of the trench bottom portion. Thereafter, the Al pattern was removed with sulfuric acid, and SiC was thermally etched by using the oxide film as a mask. Thermal etching was performed under an atmospheric pressure in a chlorine gas atmosphere at 900° C. by using a nitrogen gas as a carrier gas.

As observation of a shape change caused by thermal etching, the substrate of the sample was cleaved, and observation of the scanning electron microscopic (SEM; Scanning Electron Microscopy) image and thermal etching were alternately performed.

Figure 1:
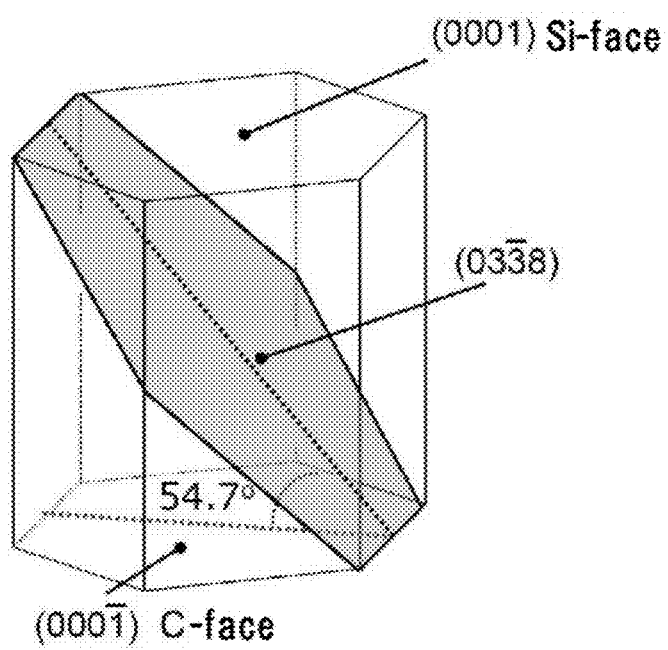
FIG. 1 illustrates explanatory view of the {03-38} crystal plane of SiC.
Figure 2:
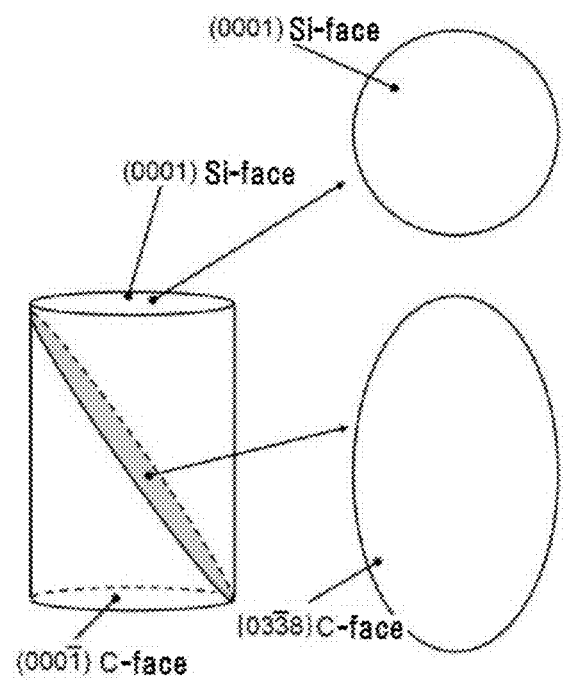
FIG. 2 illustrates explanatory view of obtaining wafers with the {03-38} planes by cutting from a single crystal mass for circular wafers with the {0001} planes.
Figure 3:
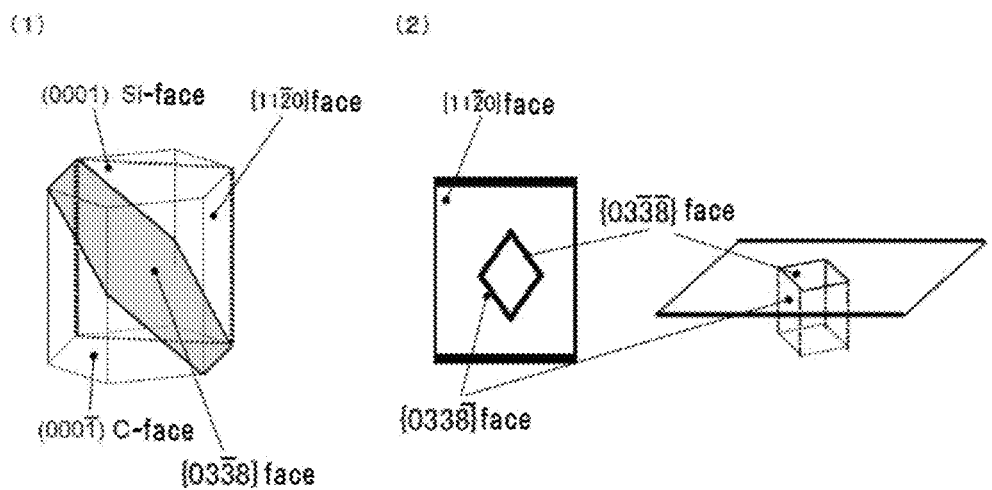
FIG. 3 illustrates explanatory view of forming trench sidewalls into the {03-38} planes by forming a trench perpendicularly on the substrate of the {11-20} plane.
Figure 4:
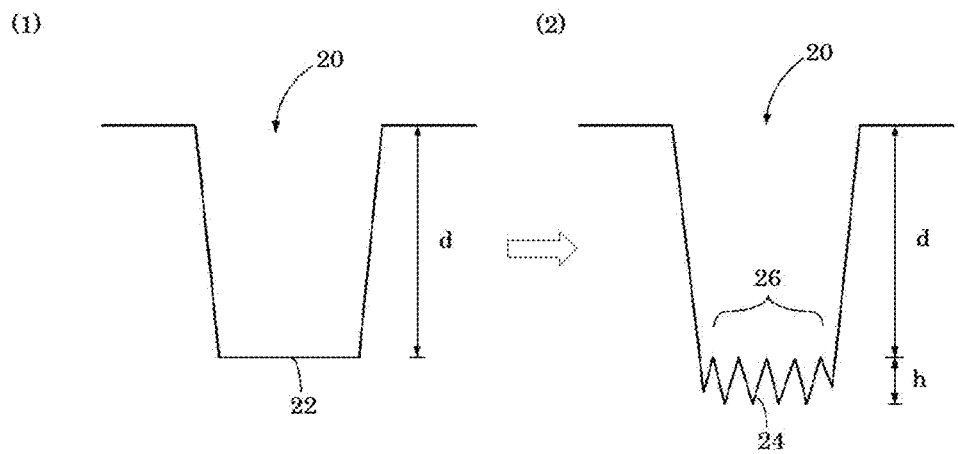
FIG. 4 illustrates explanatory view of forming unevenness on the trench bottom surface.
Figure 5:
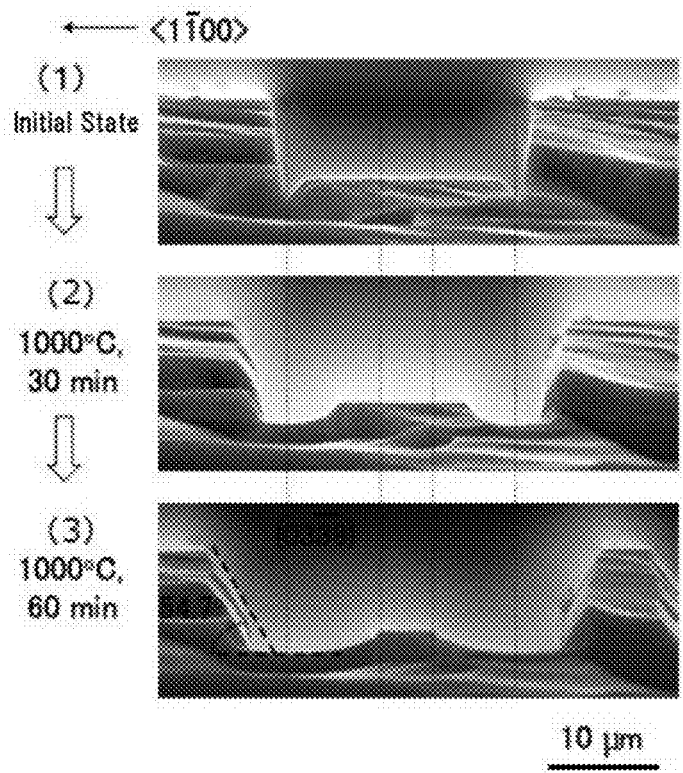
FIG. 5 illustrates SEM image (1) showing a shape change caused by thermal etching according to a first embodiment.

FIG. 5 shows SEM images observed from the [11-20] direction. FIG. 5(1) shows an SEM image after a trench was formed by plasma etching. FIG. 5(2) and FIG. 5(3) show SEM images of the trench shapes after thermal etching was applied for 30 minutes and 60 minutes in a chlorine gas atmosphere at 1000° C.

In FIG. 5(1), etching in the trench sidewall is hardly confirmed with respect to the <1-100> direction, respectively.

From FIG. 5(c) and FIG. 5(d), when thermal etching is further continued and a trench shape change is observed, it can be confirmed that a specific crystal plane appears on the portion from the trench sidewall to the trench bottom portion. This specific crystal plane is the {03-38} plane.

Figure 6:
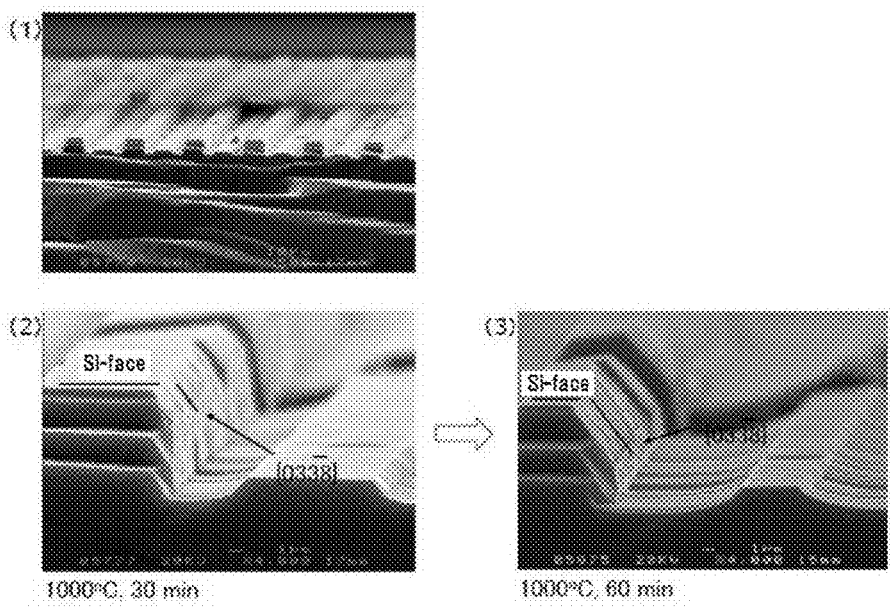
FIG. 6 illustrates SEM image (2) showing a shape change caused by thermal etching according to a first embodiment.

FIG. 6 is an SEM image imaged obliquely so that the state of the sidewalls and the trenches can easily be understood. An SEM image of a trench shape obtained after thermally etching the trenches arranged in the form of a palisade as shown in FIG. 6(1) for 30 minutes in a chlorine atmosphere at 1000° C. is shown in FIG. 6(2), and an SEM image of a trench shape obtained after further applying thermal etching for an additional 30 minutes, that is, 60 minutes in total, is shown in FIG. 6(3).

From FIG. 6(2) and FIG. 6(3), it is found that the {03-38} plane was formed on the upper edge portion being a boundary between the (0001) Si face and the trench, and with an elapse of the thermal etching time, the range of this plane increased.

From above, it is found that the shape of a trench sidewall can be controlled by using the thermal etching treatment time. It is also found that the whole of the trench sidewall can be formed into the {03-38} plane being a specific crystal plane by further lengthening the thermal etching treatment time.

Embodiment 2

In a second embodiment, obtaining of the {03-38} planes on trench sidewalls as a result of thermal etching treatment applied to a trench in a halogen-based gas atmosphere after the trench is formed in advance on the (000-1) plane of 4H-SiC by plasma etching is described in detail.

As a sample of the second embodiment, a plane having an off angle of 4 degrees with respect to the (000-1) plane of 4H-SiC was used. This is a substrate having an off angle of 4 degrees in the <11-20> direction from the (0001) plane. An oxide film to be used as a mask for thermal etching was made, and on this mask, an Al mask pattern (with a thickness of approximately 0.1 μm) for plasma etching was formed by photolithography and lifting-off. Based on the Al pattern, the oxide film and SiC were plasma-etched to form a trench on the (000-1) plane of 4H-SiC. Thereafter, the Al pattern was removed with sulfuric acid, and SiC was thermally etched by using the oxide film as a mask. Thermal etching was performed under an atmospheric pressure in a chlorine gas atmosphere at 900° C. by using a nitrogen gas as a carrier gas.

As observation of a shape change caused by thermal etching, the substrate of the sample was cleaved, and observation of the SEM image and thermal etching were alternately performed.

Figure 7:
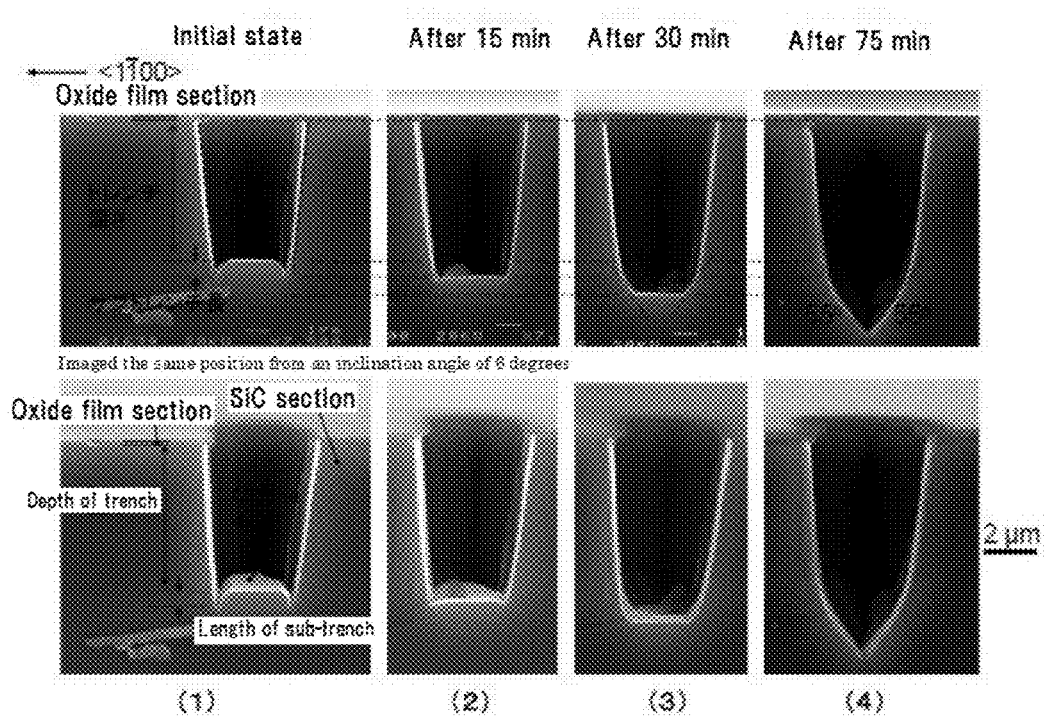
FIG. 7 illustrates SEM image (1) showing a shape change caused by thermal etching according to a second embodiment.

FIG. 7 shows SEM images observed from the [11-20] direction. FIG. 7(1) shows an SEM image after a trench was formed by plasma etching. FIG. 7(2) to FIG. 7(d) show SEM images of the trench shapes after thermal etching for 15 minutes, 30 minutes, and 75 minutes under an atmospheric pressure in a chlorine gas atmosphere at 900° C., respectively.

As shown in FIG. 7(1), although the trench depth was 5.8 μm and the sub-trench length was 0.67 μm before thermal etching, the trench depth became 6.5 μm and the sub-trench length became 0.13 μm after thermal etching as shown in FIG. 7(2), therefore, it can be confirmed that the sub-trench length was reduced.

Etching of the trench sidewalls is hardly observed with respect to both the <11-20> direction and the <1-100> direction in FIG. 7(1).

From FIG. 7(3) and FIG. 7(4), when thermal etching is further continued and a trench shape change is observed, it can be confirmed that a specific crystal plane appears on the portion from the trench sidewall to the trench bottom portion. This specific crystal plane is the {03-3-8} plane.

From above, it is found that the shape of the trench sidewall can be controlled by using the thermal etching treatment time. By further lengthening the thermal etching treatment time, the whole of the trench sidewall can be formed into the {03-3-8} plane being a specific crystal plane.

Figure 8:
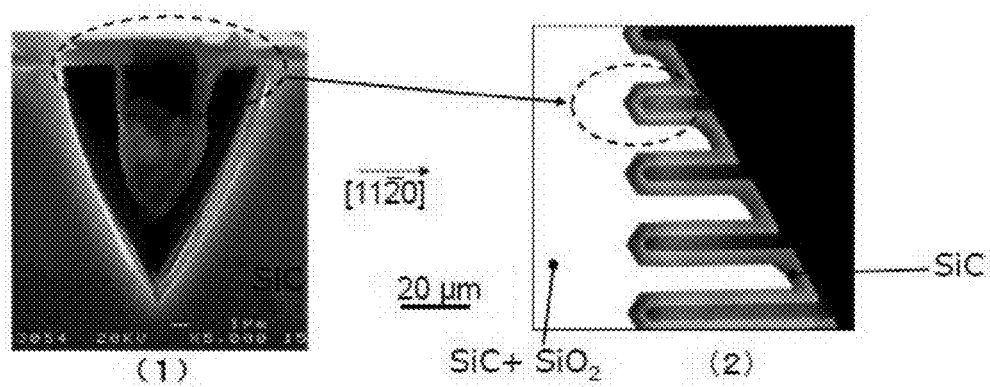
FIG. 8 illustrates SEM image (2) showing a shape change caused by thermal etching according to a second embodiment.
Figure 9:
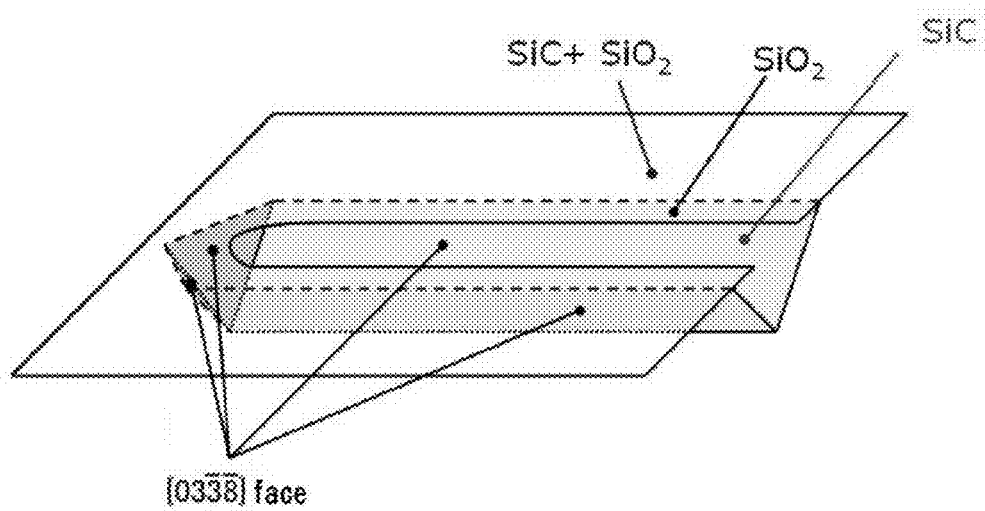
FIG. 9 illustrates explanatory view of a shape change caused by thermal etching according to a second embodiment.

FIG. 8(1) shows an SEM image of the trench shape thermally etched for 15 minutes in a mixed gas atmosphere of a chlorine gas and an oxygen gas at 1000° C. after exposure for 75 minutes to a chlorine gas atmosphere at 900° C. FIG. 8(2) shows a Nomarski image (imaged from above the C face) of the trench shape of the (000-1) C face. FIG. 9 schematically shows an external structure of a trench that can be derived from FIG. 8(1) and FIG. 8(2).

From the Nomarski image shown in FIG. 8(2), it is found that regardless of the length and shape of the trench, SiC is etched according to the mask shape and the {03-3-8} plane is formed on the trench sidewall. Here, use of the mixed gas atmosphere of a chlorine gas and an oxygen gas is for increasing the thermal etching speed. Etching treatment may be applied for a long period of time in a chlorine gas atmosphere. From FIG. 7(4) and FIG. 8(1), it is found that by further applying thermal etching, the whole of the trench sidewall can be formed into the {03-3-8} plane being a specific crystal plane.

Embodiment 3

Figure 10:
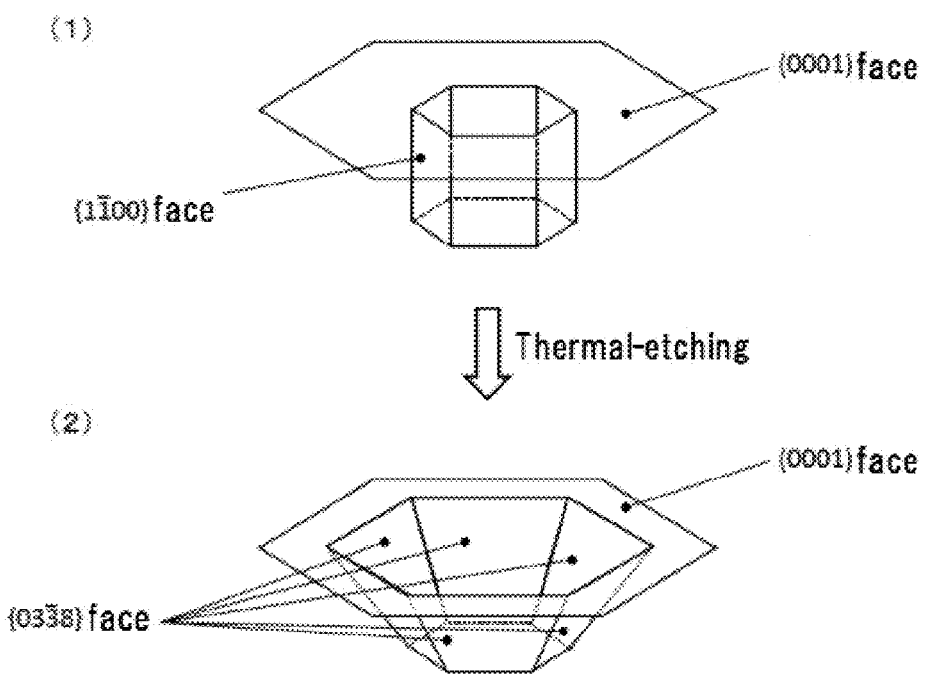
FIG. 10 illustrates schematic views of trench shapes according to a third embodiment.

A third embodiment describes that the {03-38} plane can be formed on all of the six surfaces of a trench shape being an inverted equilateral hexagonal truncated pyramid as shown in FIG. 10. By forming equivalent {03-38} planes with excellent carrier mobility on all of the six surfaces, current density can be significantly improved.

As a sample of the third embodiment, a plane having an off angle of 4 degrees with respect to the (0001) plane of 4H-SiC was used. This is a substrate having an off angle of 4 degrees in the <11-20> direction from the (0001) plane. A plurality of trenches in an equilateral hexagonal columnar shape were formed into a honeycomb shape in advance by plasma etching the (0001) plane of 4H-SiC, and then subjected to thermal etching treatment for 60 minutes under an atmospheric pressure in a mixed atmosphere of a chlorine gas and an oxygen gas at 1000° C. As a result, the {03-38} planes were obtained on trench sidewalls. Hereinafter, obtaining of the {03-38} planes on the trench sidewalls is described in detail.

Figure 11:
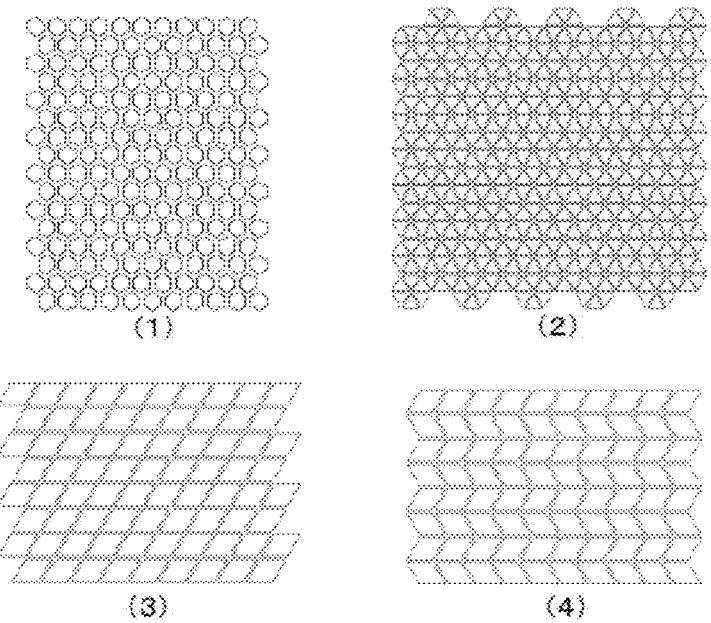
FIG. 11 illustrates SEM images (1) of trench shapes after thermal etching according to a third embodiment.

FIG. 11(1) shows a schematic view of a mask shape used in the third embodiment. Similar to the inverted equilateral hexagonal truncated pyramid in the third embodiment, trenches in the shapes of an inverted equilateral triangular truncated pyramid, an inverted equilateral hexagonal truncated pyramid, an inverted quadrangular truncated pyramid, and an inverted quadrangular pyramid can be made.

Figure 12:
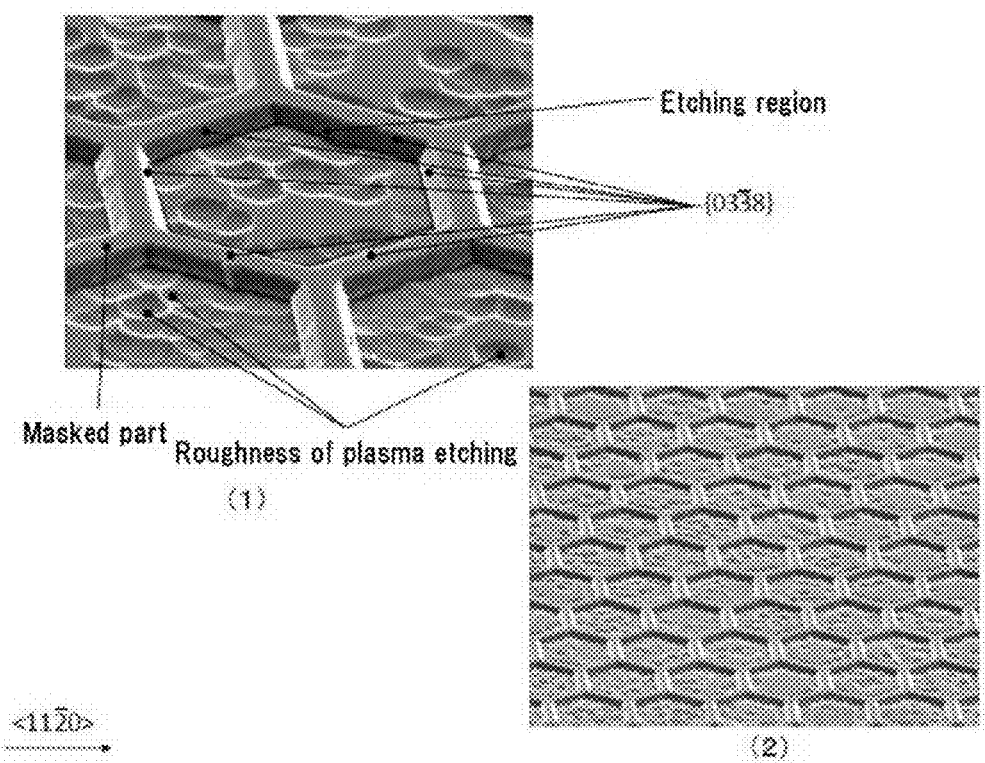
FIG. 12 illustrates SEM images (2) of trench shapes after thermal etching according to a third embodiment.
Figure 13:
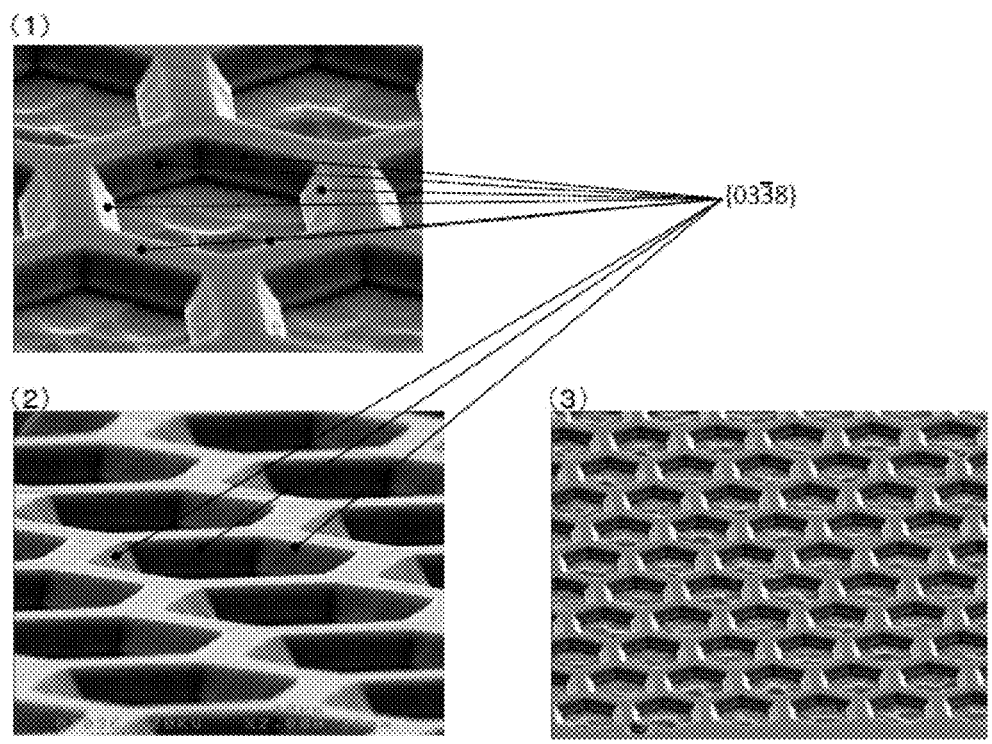
FIG. 13 illustrates a pattern of mask shapes in a fourth embodiment.
Figure 14:
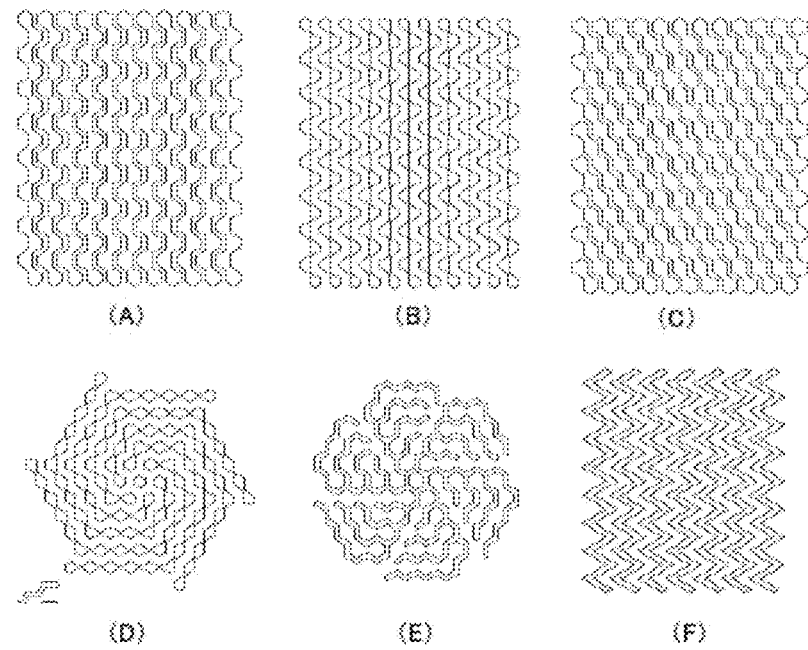
FIG. 14 illustrates SEM images (1) of trench shapes after thermal etching according to a fourth embodiment.

FIG. 12 and FIG. 13 show SEM images of trench shapes after thermal etching.

At the masked portion (refer to FIG. 12), the substrate surface of the (0001) plane appears. The unevenness observed on the bottom portions of the trenches is roughness caused by plasma etching, not caused by thermal etching treatment.

Between FIG. 12 and FIG. 13, the mask shape is the same, however, the equilateral hexagonal shape is different in size from each other. The trench depths are approximately 6 μm.

Embodiment 4

A fourth embodiment describes that the {03-38} plane can be formed on trench sidewalls so that the upper edges of the trench sidewalls adjacent to each other make an inner angle of any of 60 degrees, 120 degrees, 240 degrees, and 300 degrees and are formed continuously.

As a sample of the fourth embodiment, a plane having an off angle of 4 degrees with respect to the (0001) plane of 4H-SiC was used. This is a substrate having an off angle of 4 degrees in the <11-20> direction from the (0001) plane. A plurality of trenches were formed in advance on the (0001) plane of 4H-SiC by plasma etching so that the upper edges of the trench sidewalls adjacent to each other made an inner angle of any of 60 degrees, 120 degrees, 240 degrees, and 300 degrees and are formed continuously, and then subjected to thermal etching treatment for 60 minutes under an atmospheric pressure in a chlorine gas atmosphere at 1000° C. As a result, the {03-38} planes were obtained on the trench sidewalls. Hereinafter, obtaining of the {03-38} planes on the trench sidewalls is described in detail.

FIG. 14(A) to FIG. 14(F) show schematic views of the mask shapes used in the fourth embodiment. On a substrate having an off angle of 4 degrees from the (0001) plane of 4H-SiC, trenches in a positive pattern or a negative pattern of any of the mask shapes shown in FIG. 14 are formed in advance by using plasma etching. By forming a pattern by etching portions other than the regions surrounded by lines as shown in FIG. 14(A) to FIG. 14(F) so that the surrounded regions remain, a positive pattern is obtained. On the other hand, by forming a pattern by etching the portions of the regions surrounded by lines as shown in FIG. 14(A) to FIG. 14(F), a negative pattern is obtained. The patterns are formed so that the respective sides were along <1-100>.

FIG. 15 to FIG. 23 show SEM images of trench shapes after thermal etching with various mask patterns.

Figure 15:
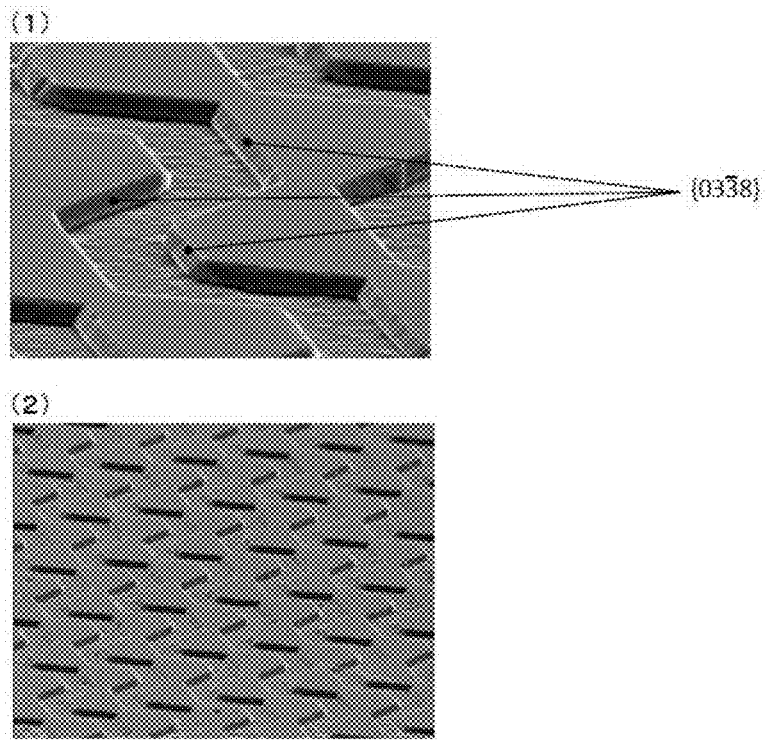
FIG. 15 illustrates SEM images (2) of trench shapes after thermal etching according to a fourth embodiment.

In FIG. 15(1) and FIG. 15(2), a pattern was formed by plasma etching so that the regions surrounded by the lines in FIG. 14(A) remained (a positive pattern was formed), and then subjected to thermal etching treatment. FIG. 15(1) is an enlarged view of FIG. 15(2). It is found that most of the trench sidewalls observed in FIG. 15(1) were formed into the {03-38} planes.

Figure 16:
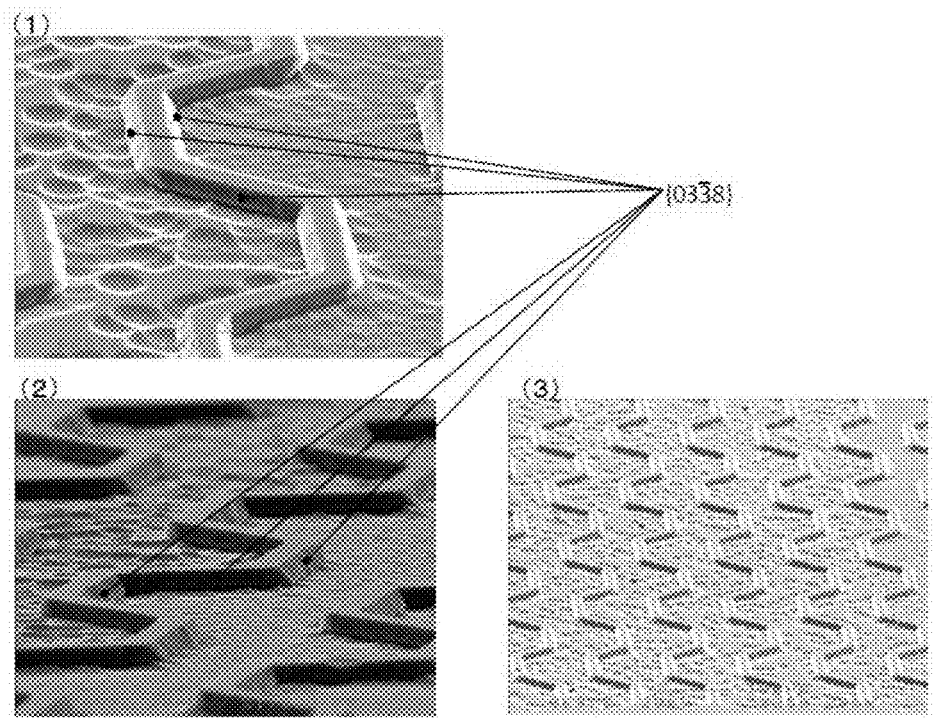
FIG. 16 illustrates SEM images (3) of trench shapes after thermal etching according to a fourth embodiment.

In FIG. 16(1) to FIG. 16(3), a pattern was formed by plasma-etching the regions surrounded by the lines in FIG. 14(A) (a negative pattern was formed), and then subjected to thermal etching treatment. FIG. 16(1) and FIG. 16(2) are enlarged views of FIG. 16(3), and are different in imaging angle from each other. As observed in FIG. 16(1) and FIG. 16(2), most of the trench sidewalls corresponding to channel portions were formed into the {03-38} planes. However, it can be confirmed that, on a convex portion of the part at which the trench sidewalls being the {03-38} planes and different crystal planes were adjacent to each other, a plane different from the {03-38} plane was partially formed by etching.

Figure 17:
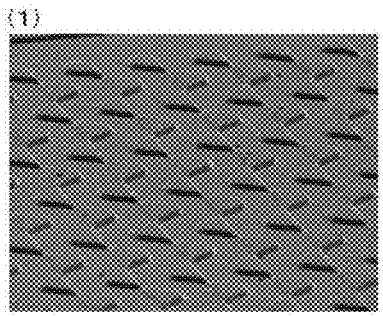
FIG. 17 illustrates SEM images (4) of trench shapes after thermal etching according to a fourth embodiment.
Figure 17:
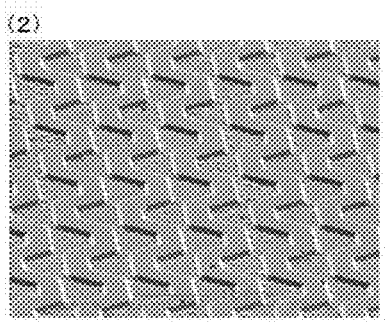
Figure 18:
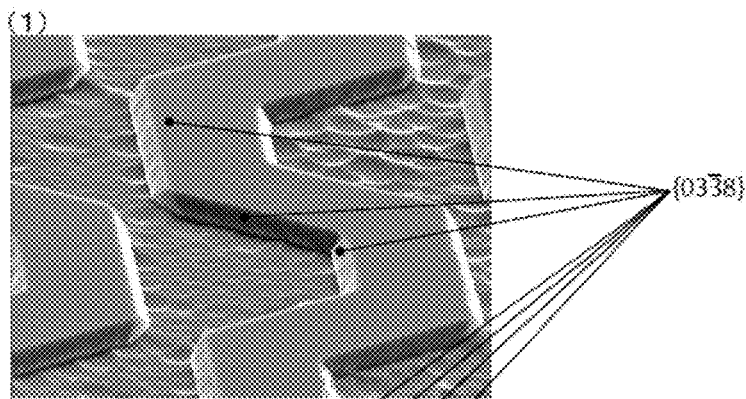
FIG. 18 illustrates SEM images (5) of trench shapes after thermal etching according to a fourth embodiment.
Figure 18:
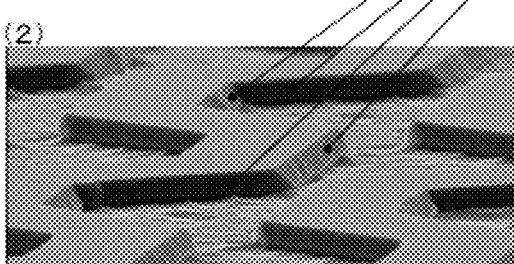
Figure 18:
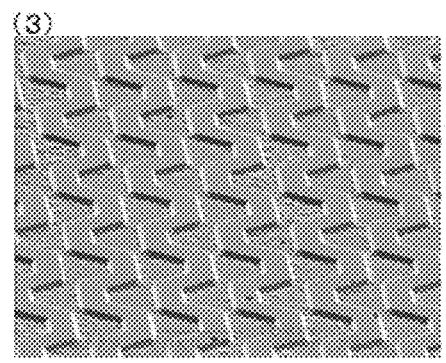

In FIG. 17(1), a pattern was formed by plasma etching so that the regions surrounded by the lines in FIG. 14(B) remained (a positive pattern was formed), and then subjected to thermal etching treatment. In FIG. 17(2), a pattern was formed by plasma etching the regions surrounded by the lines in FIG. 14(B) (a negative pattern was formed), and then subjected to thermal etching treatment. FIG. 18(1) and FIG. 18(2) are images of the pattern of FIG. 17(2) taken from different imaging angles.

Figure 19:
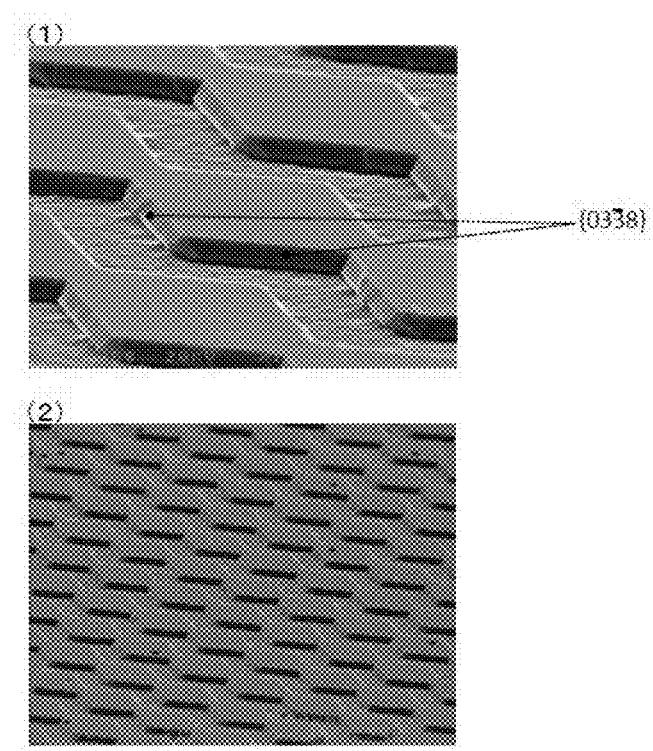
FIG. 19 illustrates SEM images (6) of trench shapes after thermal etching according to a fourth embodiment.

In FIG. 19(1) and FIG. 19(2), a pattern was formed by plasma etching so that the regions surrounded by the lines in FIG. 14(C) remained (a positive pattern was formed), and then subjected to thermal etching treatment. FIG. 19(1) is an enlarged view of FIG. 19(2). As observed in FIG. 19(1), it is found that most of the trench sidewalls corresponding to channel portions were formed into the {03-38} planes.

Figure 20:
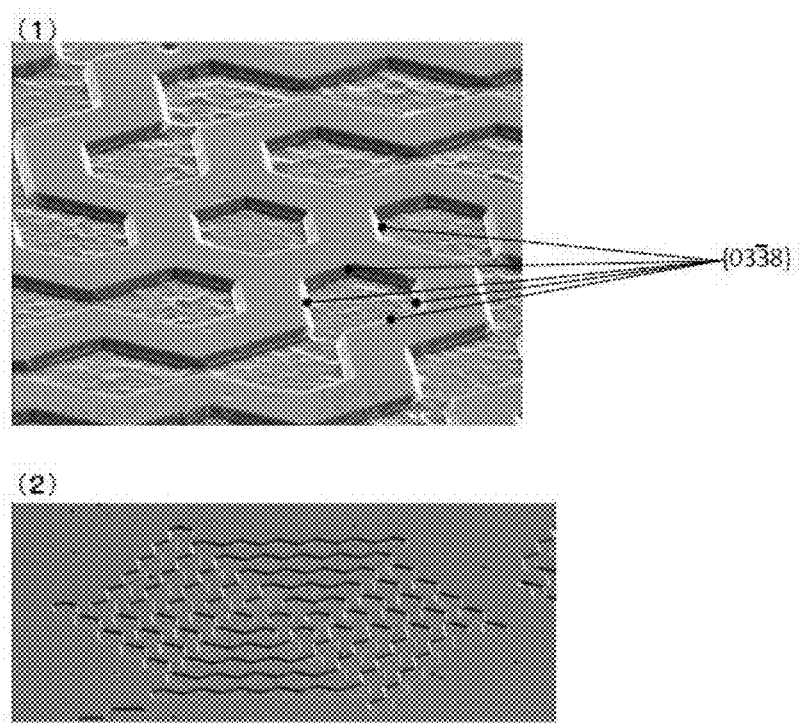
FIG. 20 illustrates SEM images (7) of trench shapes after thermal etching according to a fourth embodiment.

In FIG. 20(1) and FIG. 20(2), a pattern was formed by plasma-etching the regions surrounded by the lines in FIG. 14(D) (a negative pattern was formed), and then subjected to thermal etching treatment. FIG. 20(1) is an enlarged view of FIG. 20(2). As observed in FIG. 20(1), it is found that most of the trench sidewalls were formed into the {03-38} planes.

Figure 21:
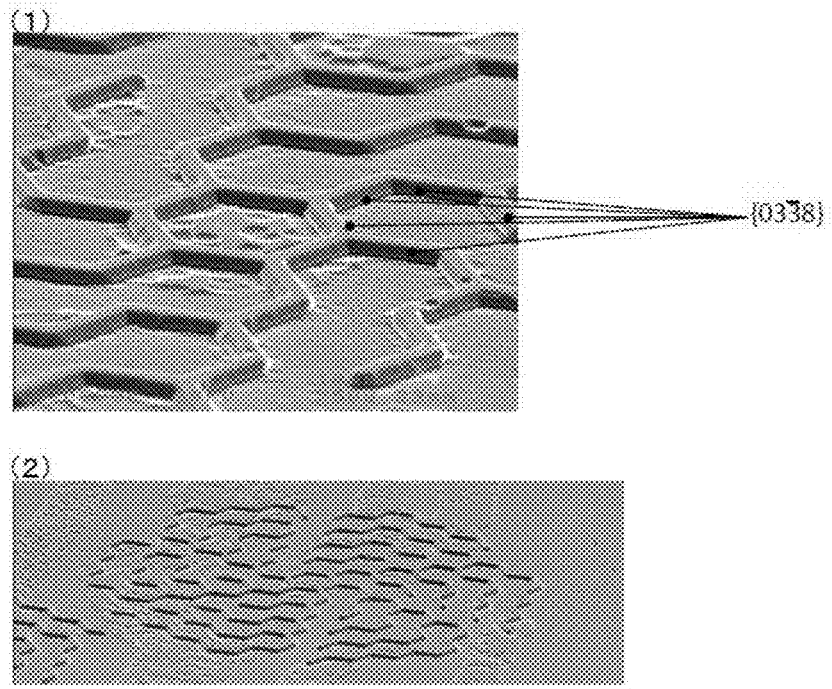
FIG. 21 illustrates SEM images (8) of trench shapes after thermal etching according to a fourth embodiment.

In FIG. 21(1) and FIG. 21(2), a pattern was formed by plasma etching so that the regions surrounded by the lines in FIG. 14(E) remained (a positive pattern was formed), and then subjected to thermal etching treatment. FIG. 21(1) is an enlarged view of FIG. 21(2). As observed in FIG. 21(1), it is found that most of the trench sidewalls were formed into the {03-38} planes.

Figure 22:
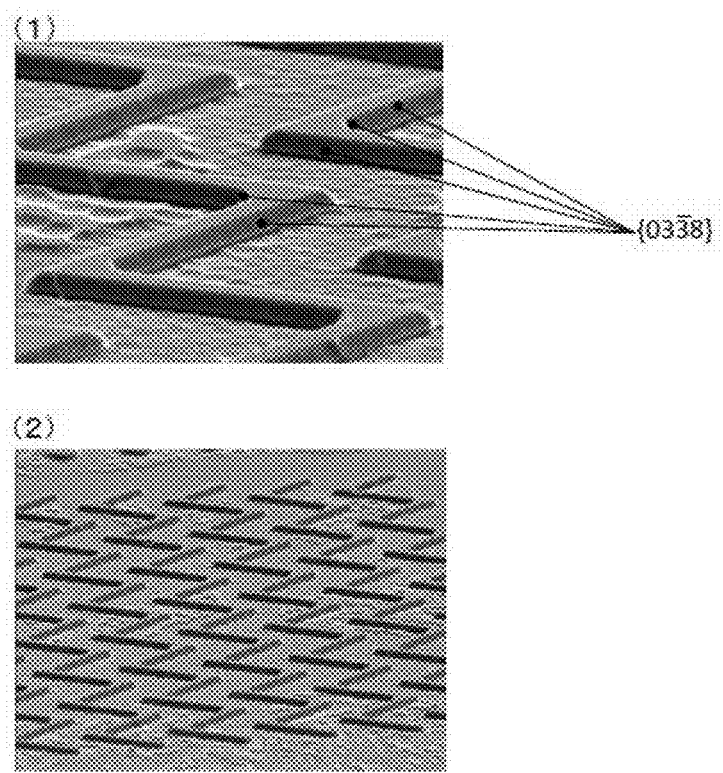
FIG. 22 illustrates SEM images (9) of trench shapes after thermal etching according to a fourth embodiment.

In FIG. 22(1) and FIG. 22(2), a pattern was formed by plasma etching so that the regions surrounded by the lines in FIG. 14(F) remained (a positive pattern was formed), and then subjected to thermal etching treatment. The regions surrounded by the lines were patterned so that the respective sides were along <1-100>. FIG. 22(1) is an enlarged view of FIG. 22(2). As observed in FIG. 22(1), it is found that most of the trench sidewalls were formed into the {03-38} planes.

Figure 23:
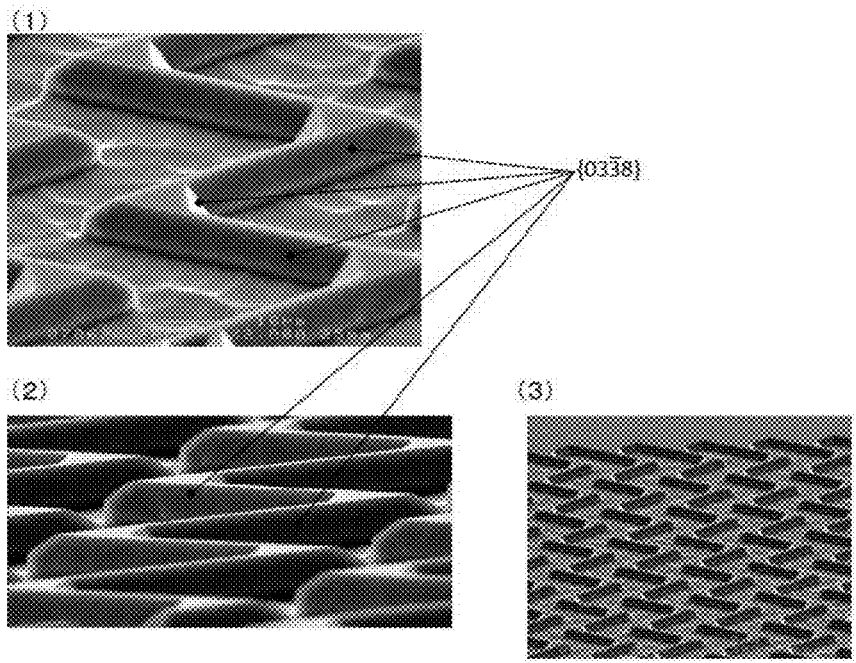
FIG. 23 illustrates SEM images (10) of trench shapes after thermal etching according to a fourth embodiment.

In FIG. 23(1) to FIG. 23(3), a pattern was formed by plasma etching so that the regions surrounded by the lines in FIG. 14(F) remained (a positive pattern was formed), and then subjected to thermal etching treatment, and this pattern is a downsized pattern of the pattern shown in FIG. 22(1) and FIG. 22(2). The regions surrounded by the lines were patterned so that the respective sides were along <1-100>. FIG. 23(1) and FIG. 23(2) are enlarged views of FIG. 23(3), and are different in imaging angle from each other. As observed in FIG. 23(1) and FIG. 23(2), it is found that most of the trench sidewalls were formed into the {03-38} planes.

As described above, it is found that, by performing thermal etching treatment, the {03-38} plane can be formed on most of the trench sidewalls. By forming equivalent {03-38} planes with excellent carrier mobility on the crystal planes of the trench sidewalls, the current density can be significantly improved, so that an improvement in the performance of the SiC semiconductor device can be expected by the present invention.

Embodiment 5

A fifth embodiment describes that the {03-3-8} plane can be formed on all of the six surfaces of a trench shape being an inverted equilateral hexagonal truncated pyramid as shown in FIG. 10. By forming equivalent {03-3-8} planes with excellent carrier mobility on the six surfaces, current density can be significantly improved.

As a sample of the fifth embodiment, a plane having an off angle of 4 degrees with respect to the (000-1) plane of 4H-SiC was used. This is a substrate having an off angle of 4 degrees in the <11-20> direction from the (000-1) plane. A plurality of trenches in equilateral hexagonal columnar shapes were formed into a honeycomb shape in advance by plasma etching the (000-1) plane of 4H-SiC, and then subjected to thermal etching treatment for 60 minutes under an atmospheric pressure in a mixed atmosphere of chlorine and oxygen at 1000° C. As a result, the {03-3-38} planes were obtained on trench sidewalls. The mask shape shown in the schematic view of FIG. 11(1) was used in the fifth embodiment as in the case of the third embodiment.

Figure 24:
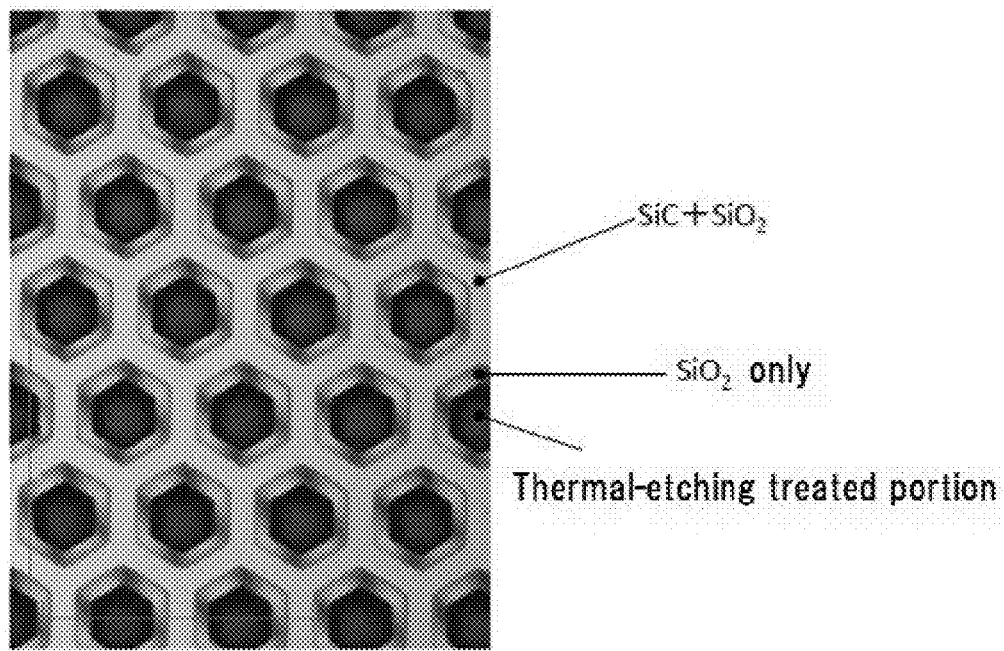
FIG. 24 illustrates explanatory view of masked part and thermal-etching treated portion according to a fifth embodiment.

As shown in FIG. 24, a number of hexagons are arranged in a honeycomb shape, and the circumferences of the hexagons are masked with an oxide film, and a number of trenches forming a honeycomb shape of hexagons are formed. The insides of the hexagons are subjected to thermal etching treatment.

Figure 25:
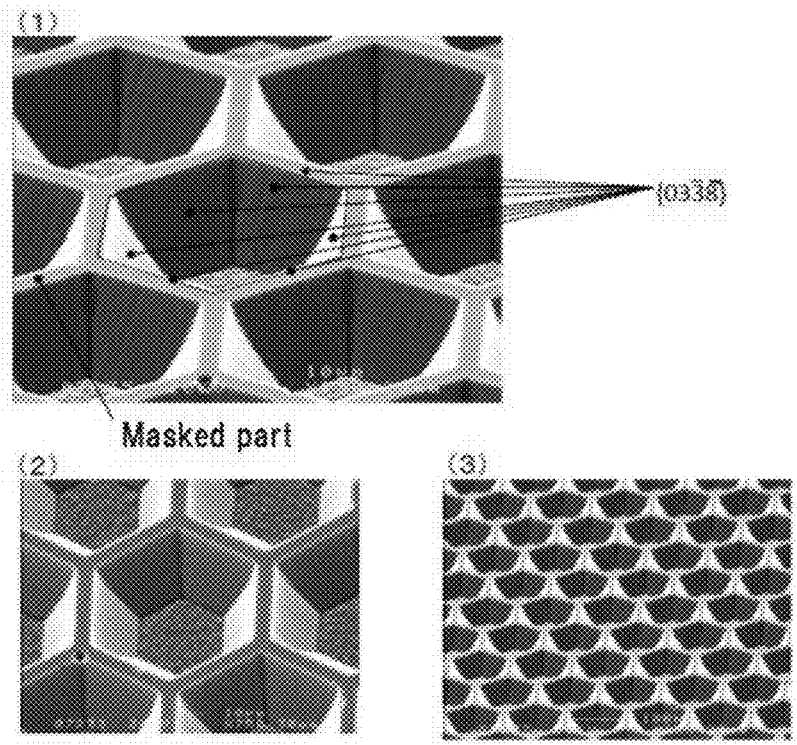
FIG. 25 illustrates SEM images (1) of trench shapes after thermal etching according to a fifth embodiment.
Figure 26:
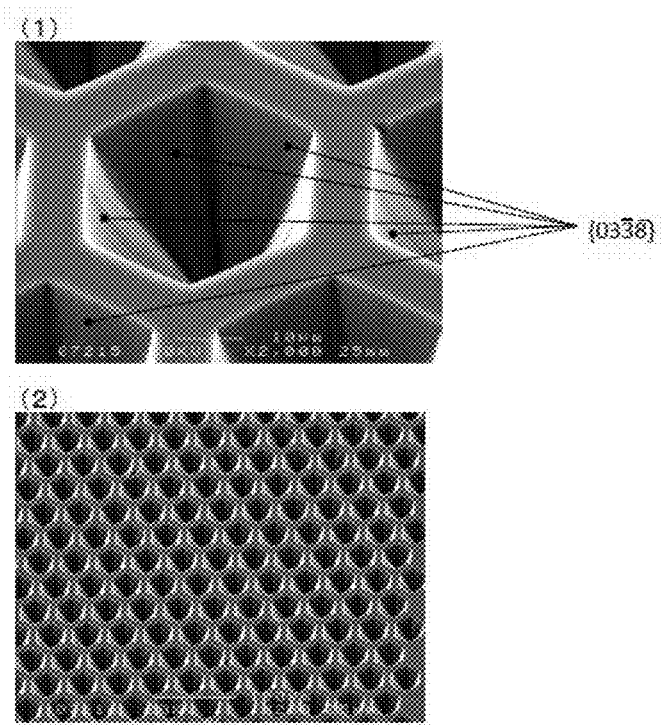
FIG. 26 illustrates SEM images (2) of trench shapes after thermal etching according to a fifth embodiment.
Figure 27:
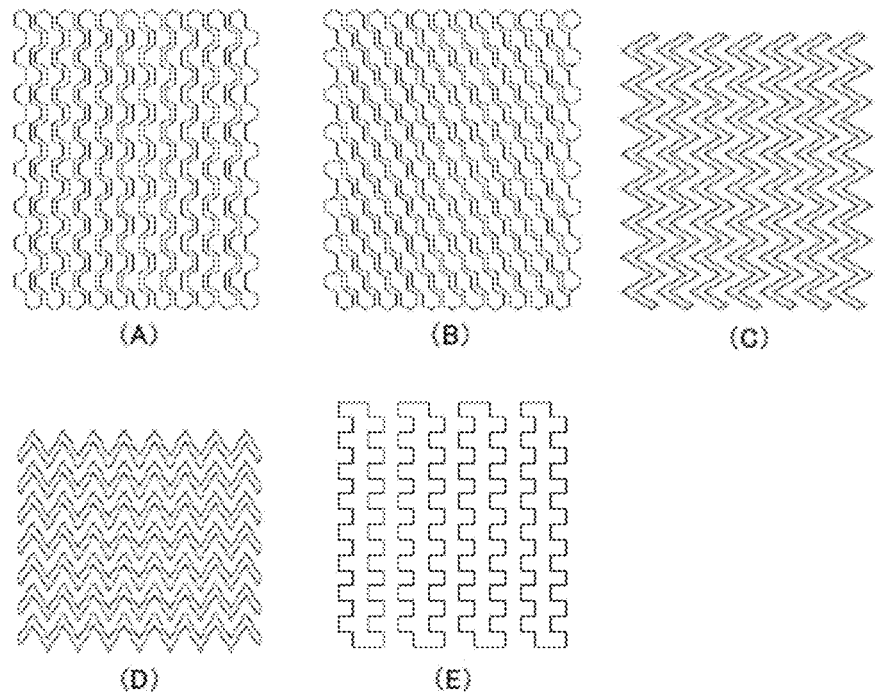
FIG. 27 illustrates a pattern of mask shapes in a sixth embodiment.

FIG. 25 and FIG. 26 show SEM images of trench shapes after thermal etching. At the portion masked with the oxide film, the substrate surface of the (000-1) plane appears. The unevenness observed on the bottom portions of the trenches is roughness caused by plasma etching, not caused by thermal etching treatment.

Between FIG. 25 and FIG. 26, the mask shape is the same, however, the equilateral hexagonal shape is different in size from each other. The trench depths are approximately 32 μm.

Embodiment 6

A sixth embodiment describes that the {03-3-8} plane can be formed on trench sidewalls so that the upper edges of the trench sidewalls adjacent to each other make an inner angle of any of 60 degrees, 120 degrees, 240 degrees, and 300 degrees and are formed continuously.

As a sample of the sixth embodiment, a plane having an off angle of 4 degrees with respect to the (000-1) plane of 4H-SiC was used. This is a substrate having an off angle of 4 degrees in the <11-20> direction from the (000-1) plane. By plasma etching, a plurality of trenches were formed in advance on the (000-1) plane of 4H-SiC so that the upper edges of the trench sidewalls adjacent to each other made an inner angle of any of 60 degrees, 120 degrees, 240 degrees, and 300 degrees and were formed continuously, and then subjected to thermal etching treatment for 20 minutes under an atmospheric pressure in a mixed atmosphere of a chlorine gas and an oxygen gas at 1000° C. As a result, the {03-3-8} planes were obtained on the trench sidewalls. Hereinafter, obtaining of the {03-3-8} planes on the trench sidewalls is described in detail.

FIG. 27(A) to FIG. 27(E) show schematic views of the mask shapes used in the sixth embodiment. On the substrate having an off angle of 4 degrees from the (000-1) plane of 4H-SiC, trenches in a pattern of any of the mask shapes shown in FIG. 27 are formed in advance by using plasma etching. By forming a pattern by etching portions other than the regions surrounded by the lines shown in FIG. 27(A) to FIG. 27(E) so that the surrounded regions remain, a positive pattern is formed. On the other hand, by etching the regions surrounded by the lines shown in FIG. 27(A) to FIG. 27(E), a negative pattern is formed. The pattern is formed so that the respective sides become parallel to <1-100>.

FIG. 28 to FIG. 38 show SEM images of trench shapes after thermal etching in various mask patterns.

Figure 28:
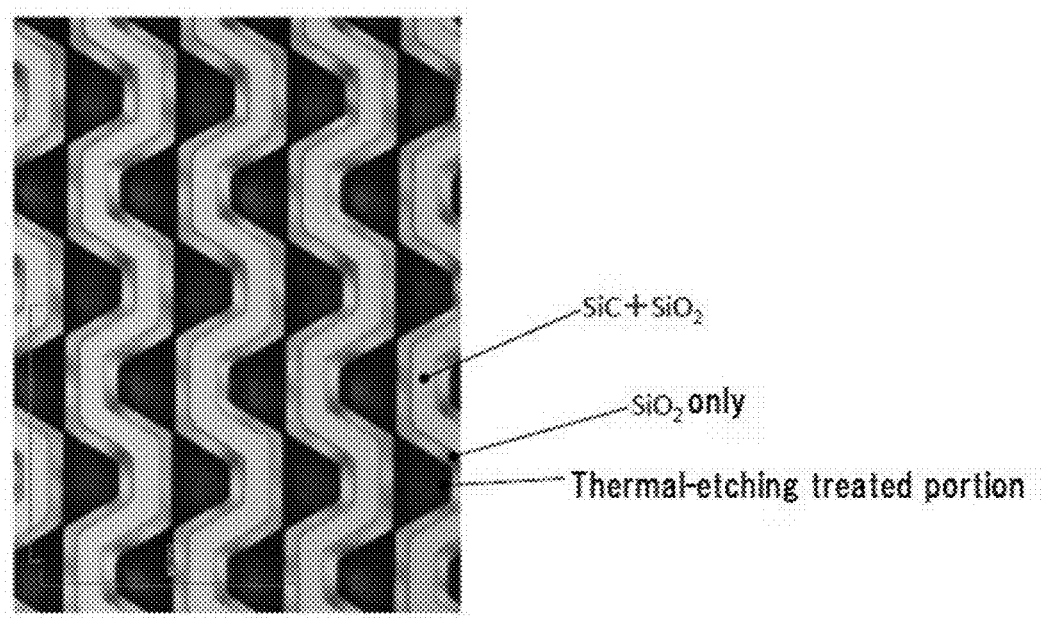
FIG. 28 illustrates explanatory view (1) of masked part and thermal-etching treated portion according to a sixth embodiment.
Figure 29:
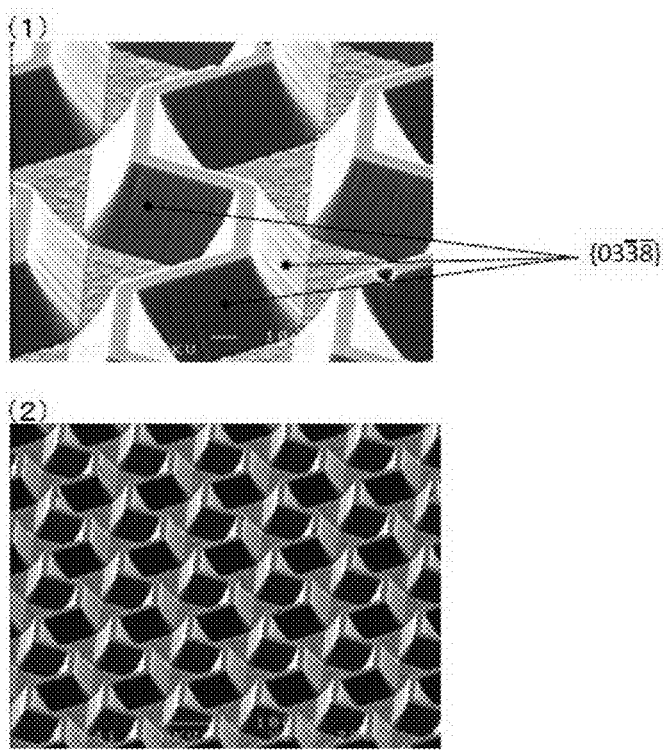
FIG. 29 illustrates SEM images (1) of trench shapes after thermal etching according to a sixth embodiment.
Figure 30:
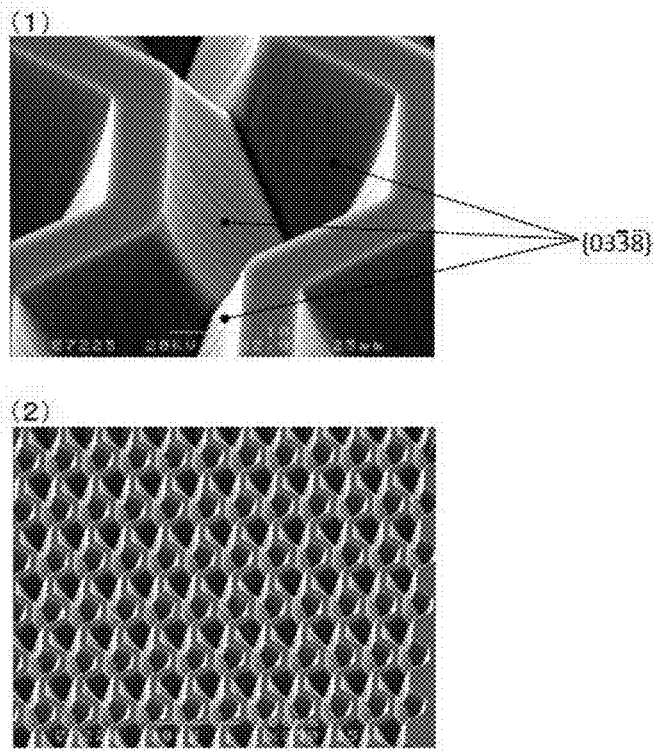
FIG. 30 illustrates SEM images (2) of trench shapes after thermal etching according to a sixth embodiment.

As shown in FIG. 28, a pattern is formed by plasma-etching the regions surrounded by the lines in FIG. 27(A) (a negative pattern is formed), and then subjected to thermal etching treatment. FIG. 29 and FIG. 30 show SEM images of the trench shapes after thermal etching. At the portion masked with the oxide film, the substrate surface of the (000-1) plane appears. The unevenness observed on the bottom portions of the trenches shown in FIG. 29(1) is roughness caused by plasma etching, not caused by thermal etching treatment. Between FIG. 29 and FIG. 30, the mask shape is the same, however, the pattern is different in size from each other. FIG. 29(1) and FIG. 30(1) are enlarged views enlarged 10 times the size of FIG. 29(2) and FIG. 30(2), respectively. From the scales of the SEM images shown in FIG. 29(1) and FIG. 30(1), it is found that the width of the portion at which the substrate surface remains is approximately 8 μm. It is found that most of the trench sidewalls observed in FIG. 29(1) and FIG. 30(1) are formed into the {03-3-8} planes.

Figure 31:
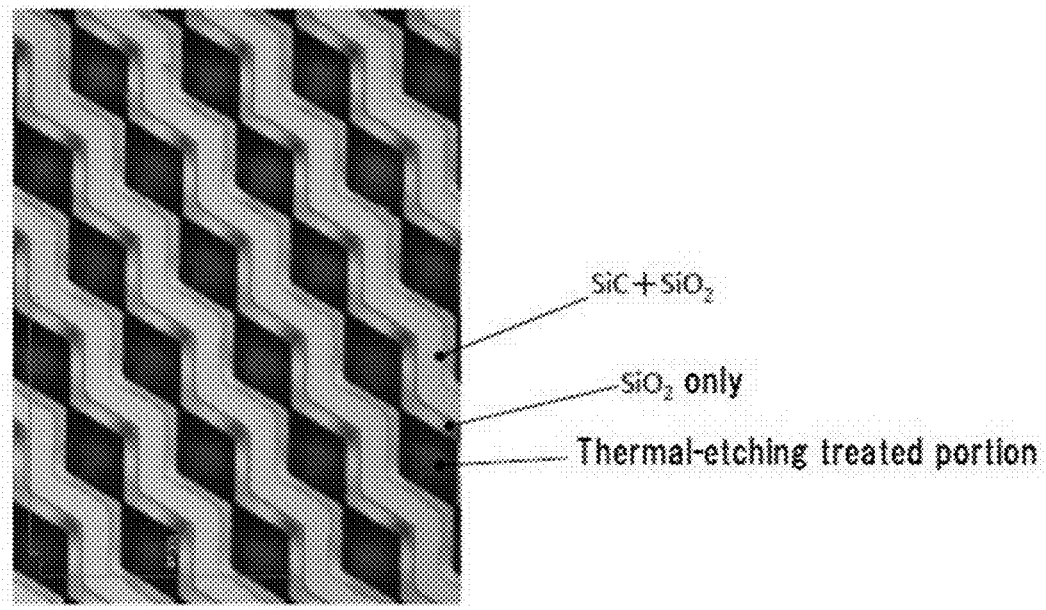
FIG. 31 illustrates explanatory view (2) of masked part and thermal-etching treated portion according to a sixth embodiment.
Figure 32:
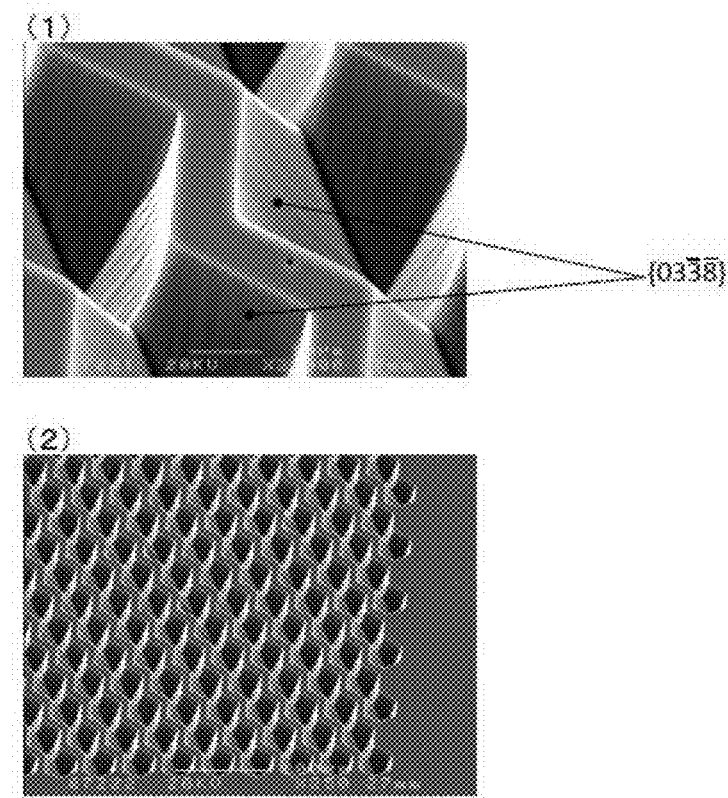
FIG. 32 illustrates SEM images (3) of trench shapes after thermal etching according to a sixth embodiment.

As shown in FIG. 31, a pattern is formed by plasma-etching the regions surrounded by the lines in FIG. 27(B) (a negative pattern is formed), and then subjected to thermal etching treatment. FIG. 32 shows SEM images of trench shapes after thermal etching. At the portion masked with the oxide film, the substrate surface of the (000-1) plane appears. FIG. 32(1) is an enlarged view enlarged 10 times the size of FIG. 32(2). From the scale of the SEM image shown in FIG. 32(1), it is found that the width of the portion at which the substrate surface remains is approximately 8 μm. It is found that most of the trench sidewalls observed in FIG. 32(1) are formed into the {03-3-8} planes.

Figure 33:
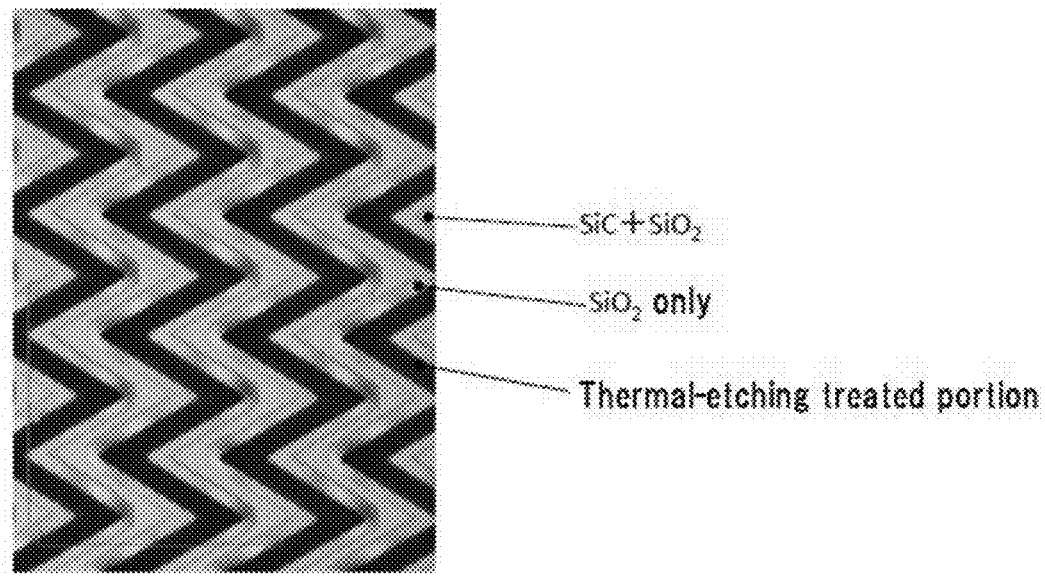
FIG. 33 illustrates explanatory view (3) of masked part and thermal-etching treated portion according to a sixth embodiment.
Figure 34:
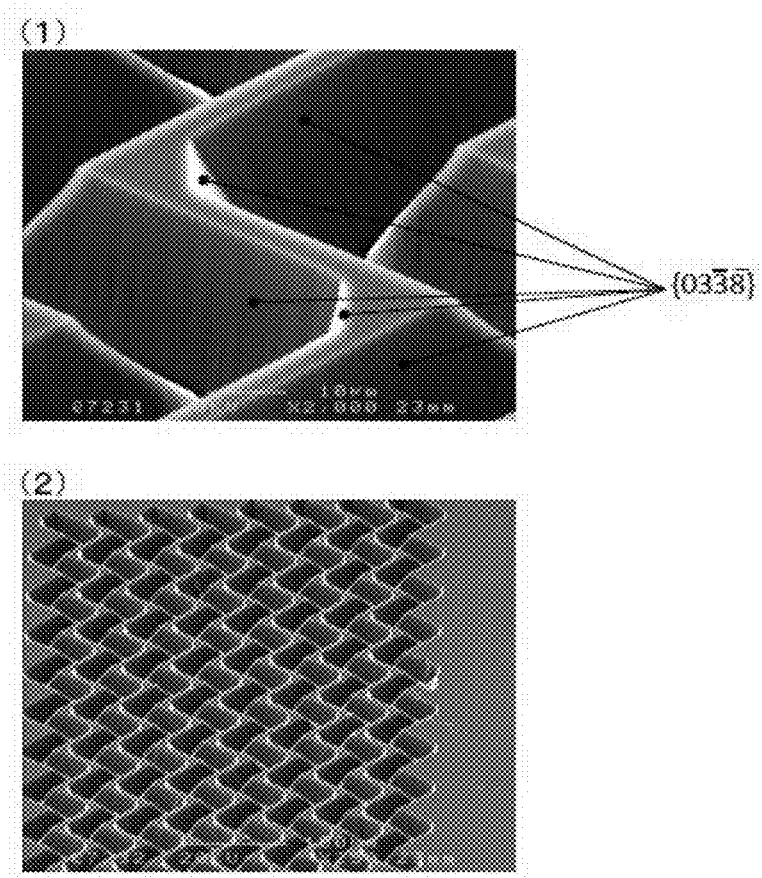
FIG. 34 illustrates SEM images (4) of trench shapes after thermal etching according to a sixth embodiment.

As shown in FIG. 33, a pattern is formed by plasma-etching the regions surrounded by the lines in FIG. 27(C) (a negative pattern is formed), and then subjected to thermal etching treatment. FIG. 34 shows SEM images of trench shapes after thermal etching. At the portion masked with the oxide film, the substrate surface of the (000-1) plane appears. FIG. 34(1) is an enlarged view enlarged 10 times the size of FIG. 34(2). From the scale of the SEM image shown in FIG. 34(1), it is found that the width of the portion at which the substrate surface remains is approximately 3 μm to 5 μm. It is found that most of the trench sidewalls observed in FIG. 34(1) are formed into the {03-3-8} planes.

Figure 35:
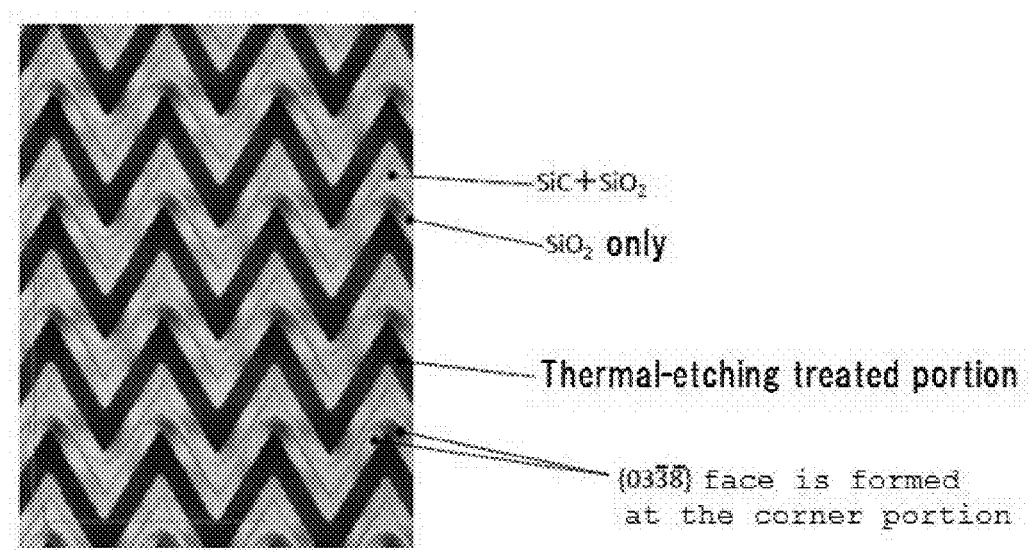
FIG. 35 illustrates explanatory view (4) of masked part and thermal-etching treated portion according to a sixth embodiment.
Figure 36:
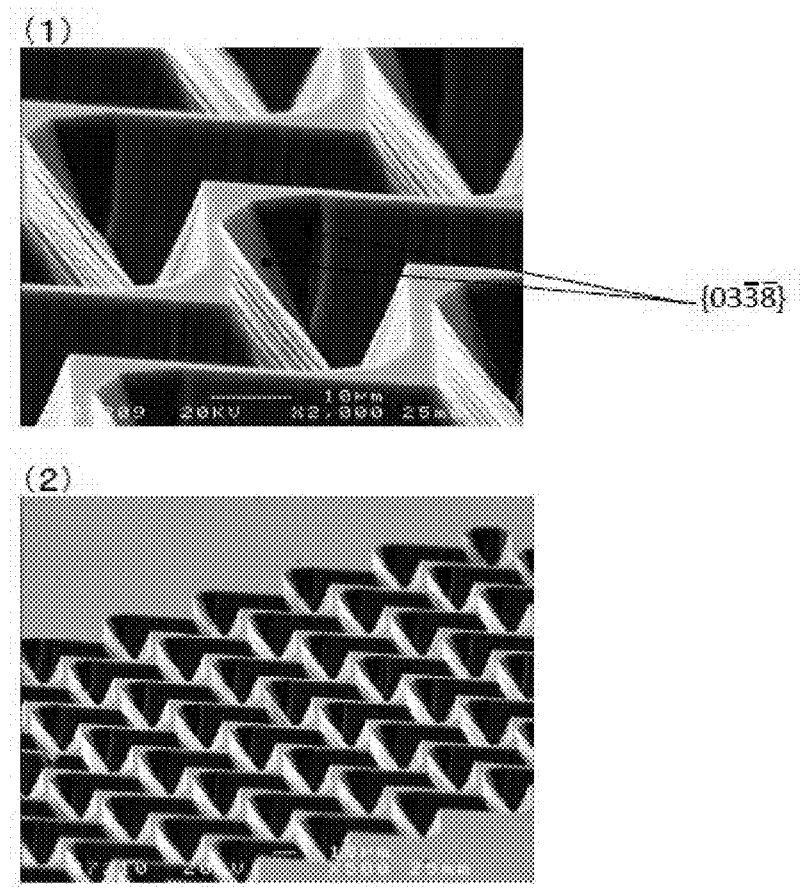
FIG. 36 illustrates SEM images (5) of trench shapes after thermal etching according to a sixth embodiment.

As shown in FIG. 35, a pattern is formed by plasma-etching the regions surrounded by the lines in FIG. 27(D) (a negative pattern is formed), and then subjected to thermal etching. FIG. 36 shows SEM images of trench shapes after thermal etching treatment. At the portion masked with an oxide film, the substrate surface of the (000-1) plane appears. FIG. 36(1) is an enlarged view enlarged 5 times the size of FIG. 36(2). From the scale of the SEM image shown in FIG. 36(1), it is found that the width of the portion at which the substrate surface remains is approximately 1 μm to 3 μm. From FIG. 36(1), it is found that the trench sidewall at the corner portion is formed into the {03-3-8} plane.

Figure 37:
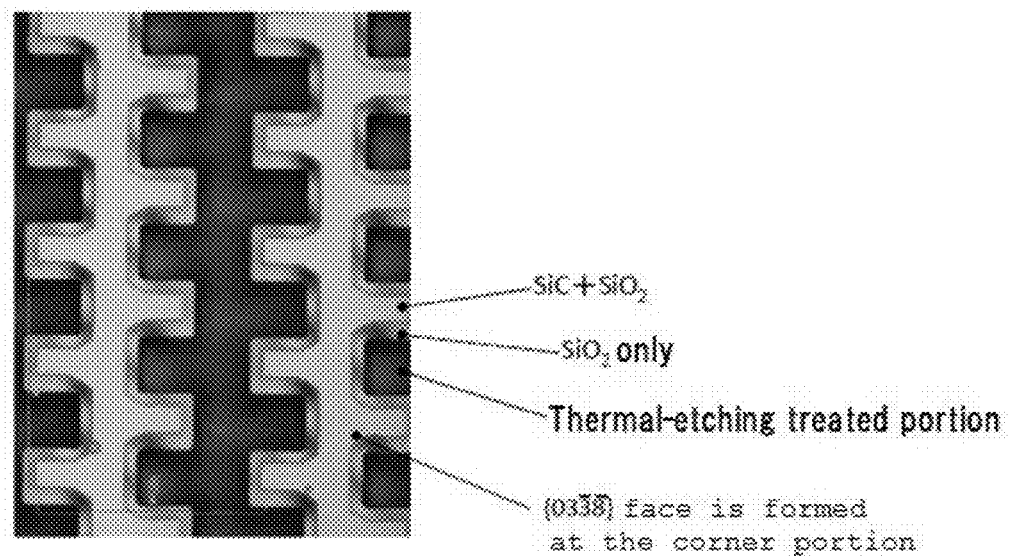
FIG. 37 illustrates explanatory view (5) of masked part and thermal-etching treated portion according to a sixth embodiment.
Figure 38:
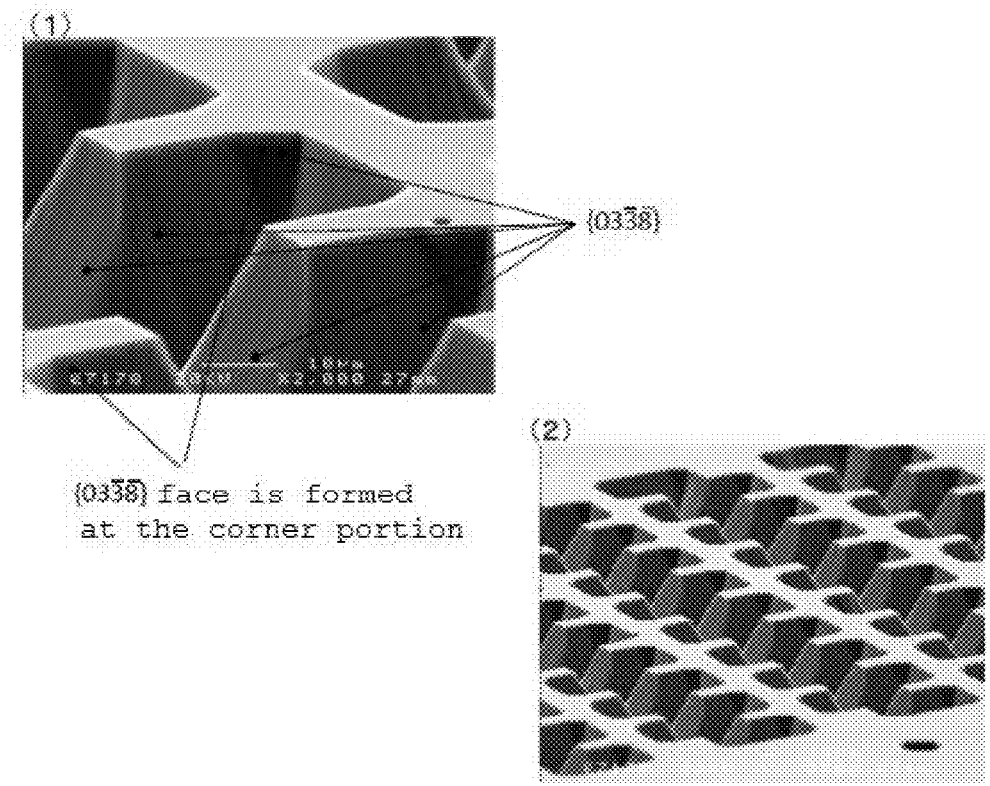
FIG. 38 illustrates SEM images (6) of trench shapes after thermal etching according to a sixth embodiment.

As shown in FIG. 37, a pattern is formed by plasma-etching the regions surrounded by the lines in FIG. 27(E) (a negative pattern is formed), and then subjected to thermal etching treatment. FIG. 38 shows SEM images of trench shapes after thermal etching. At the portion masked with an oxide film, the substrate surface of the (000-1) plane appears. FIG. 38(1) is an enlarged view enlarged 5 times the size of FIG. 38(2). From the scale of the SEM image shown in FIG. 38(1), it is found that the width of the portion at which the substrate surface remains is approximately 5 μm to 10 μm. From FIG. 38(1), it is found that the trench sidewall at the corner portion is formed into the {03-3-8} plane.

As described above, it is found that the {03-3-8} plane can be formed on most of the trench sidewalls by applying thermal etching treatment. By forming equivalent {03-3-8} planes with excellent carrier mobility on the crystal planes of trench sidewalls, the current density can be significantly improved, so that an improvement in the performance of the SiC semiconductor device can be expected by the present invention.

Embodiment 7

From the embodiments described above, it is found that by forming trenches on a substrate of the (0001) plane or (000-1) plane of SiC in advance and then applying thermal etching treatment, the {03-38} planes or {03-3-8} planes are obtained on the trench sidewalls.

As a trench structure, there are a structure in a honeycomb shape composed of a number of hexagonal pyramids, a groove-shaped structure, and a structure bent so that a specific angle is formed between trench sidewalls adjacent to each other and the trench sidewalls are continued in a serrated shape.

Figure 39:
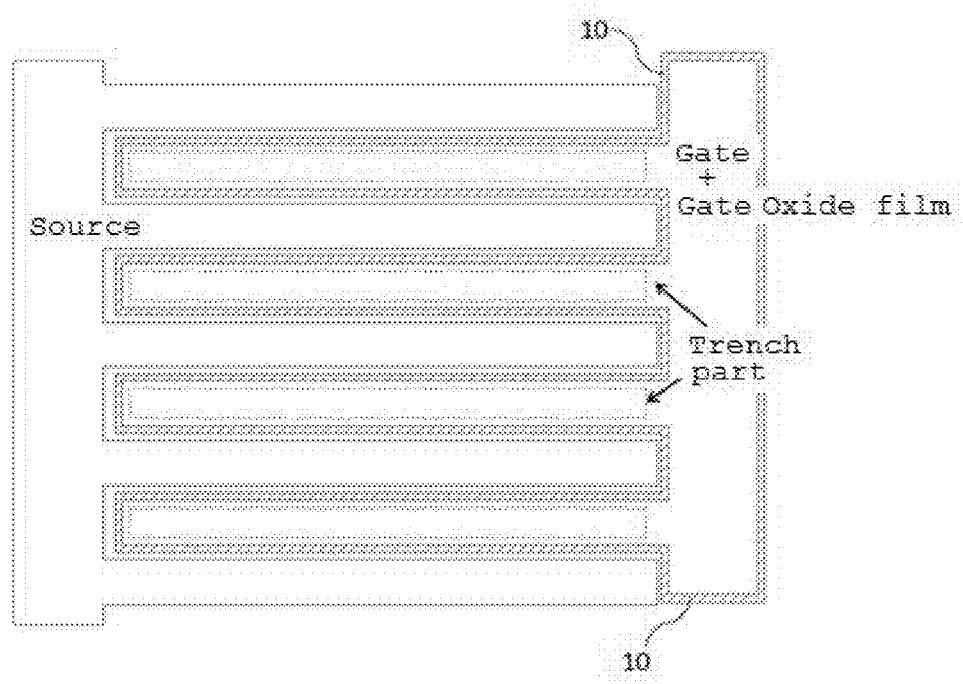
FIG. 39 illustrates layout plan (1) of the gate and source electrodes to manufacture a MOSFET device.
Figure 40:
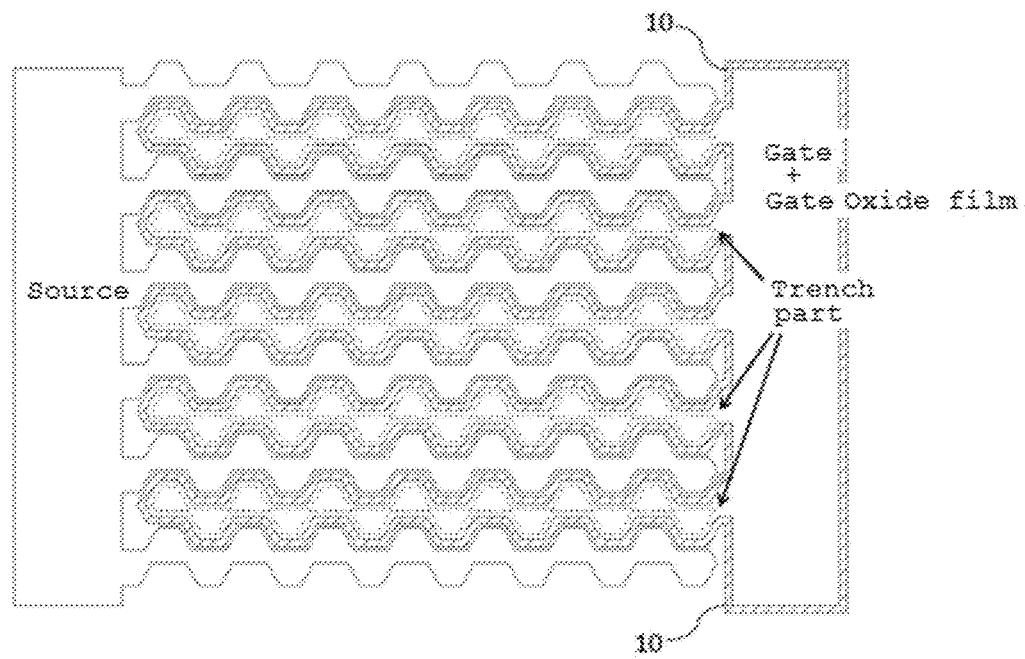
FIG. 40 illustrates layout plan (2) of the gate and source electrodes to manufacture a MOSFET device.
Figure 41:
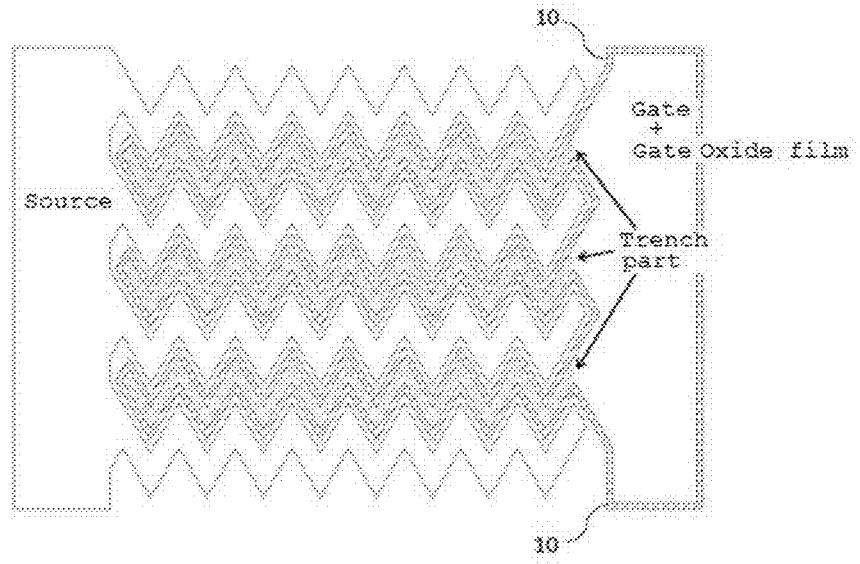
FIG. 41 illustrates layout plan (3) of the gate and source electrodes to manufacture a MOSFET device.

FIG. 39 to FIG. 41 are conceptual diagrams of layout of the gate and source electrodes to manufacture a MOSFET device on the substrate of the (0001) plane or (000-1) plane of SiC.

FIG. 39 to FIG. 41 are views of the substrate from above, and in the respective views, the source electrode is shown on the left side and the gate electrode is shown on the right side. The source electrode and the gate electrode are arranged to alternately mesh with each other in a comb-like shape. The shaded portion 10 denotes a gate oxide film. The trench portions are shown in the respective drawings, and the trench portions are shown as portions surrounded by dashed lines in FIG. 39 and FIG. 40, and are shown as dot-patterned regions in FIG. 41. The gate electrode is layered on the gate oxide film, therefore, they are shown as "gate+gate oxide film" in the respective drawings.

In FIG. 39, the trench structure has a rectangular groove shape. In this case, the {03-38} plane or the {03-3-8} plane is to be formed on trench sidewalls in the transverse direction when the drawing is viewed from the front side.

In FIG. 40 and FIG. 41, the trench structure is bent so that a specific angle is formed between trench sidewalls adjacent to each other and the trench sidewalls are continued in a serrated shape. In the case of FIG. 40, the trench structure is to be formed so that the upper edges of the trench sidewalls adjacent to each other make an inner angle of 120 degrees or 240 degrees and are formed continuously, and the {03-38} plane or the {03-3-8} plane is formed on most of the trench sidewalls. In the case of FIG. 41, the trench structure is formed so that the upper edges of the trench sidewalls adjacent to each other make an inner angle of 60 degrees or 300 degrees and are formed continuously, and in this case, the {03-38} plane or the {03-3-8} plane is also formed on most of the trench sidewalls. In FIG. 41, the left end portion of the trench is bent at 120 degrees.

By forming the gate pattern shapes shown in FIG. 40 and FIG. 41, the area of the gate sidewall channel portion can be increased as compared with the rectangular gate pattern shape shown in FIG. 39, and a larger current can be handled.

Figure 42:
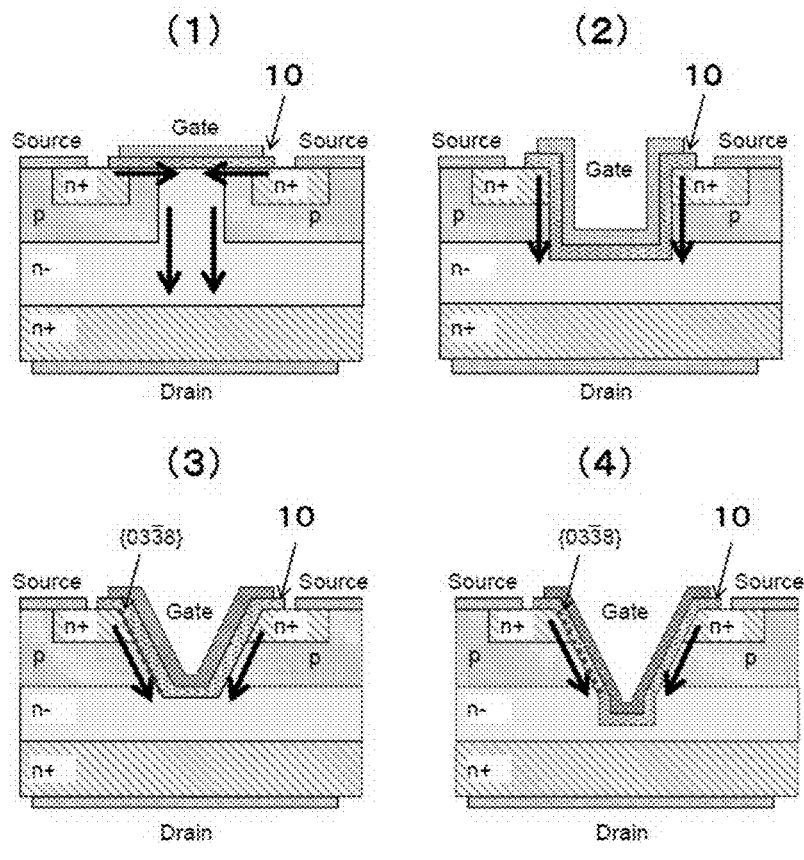
FIG. 42 illustrates explanatory view of the structure of the MOSFET.

FIG. 42 is an explanatory view of the structure of the MOSFET (sectional view of the substrate viewed sideways).

FIG. 42(1) is a block diagram of a general MOSFET, FIG. 42(2) is a block diagram of a trench type MOSFET, and FIG. 42(3) and FIG. 42(4) are block diagrams of MOSFETs including trench sidewalls tilted to form a V shape. In FIG. 42, a portion with a current flow is indicated with an arrow. The trench type MOSFETs shown in FIG. 42(3) and FIG. 42(4) including the {03-38} planes or {03-3-8} planes formed on trench sidewalls have channel mobility larger by one or two orders of magnitude than that of general MOSFETs and trench-type MOSFETs, so that the MOSFET device performance is improved.

Here, a method for manufacturing this MOSFET is briefly described.

(1) n- and p-layers are formed by epitaxial growth or ion implantation on a single crystal substrate of 4H-SiC.

(2) Thereafter, an n+ layer is locally formed by ion implantation.

(3-1) In the case of the Si face, a trench is formed by plasma etching in a region in which channels are formed, and then, the {03-38} planes are formed by thermal etching treatment.

(3-2) In the case of the C face, the surface is covered with an oxide film and a trench is formed by plasma etching in a region in which channels are formed, or an oxide film is patterned, and then, the {03-3-8} planes are formed by thermal etching treatment.

(4) Thereafter, a gate oxide film is formed, and electrodes are formed in the gate, source, and drain regions.

Thus, according to the present invention, the {03-38} plane or {03-3-8} plane can easily be formed on tilted surfaces of a V-shaped MOSFET or trench sidewalls of a trench type MOSFET, so that it can be expected that the mobility of the gate channel (channel mobility) is improved and the device performance of the MOSFET device is improved.

Embodiment 8

In the embodiments described above, obtaining of trench sidewalls being specific planes by forming a trench from the (0001) plane or (000-1) plane being a basal plane of 4H-SiC is described.

The present eighth embodiment shows a result of obtaining trench sidewalls (6 surfaces) tilted at approximately 55 degrees by forming a trench from the (000-1) plane being a basal plane of 6H-SiC having a hexagonal crystal structure.

Figure 43:
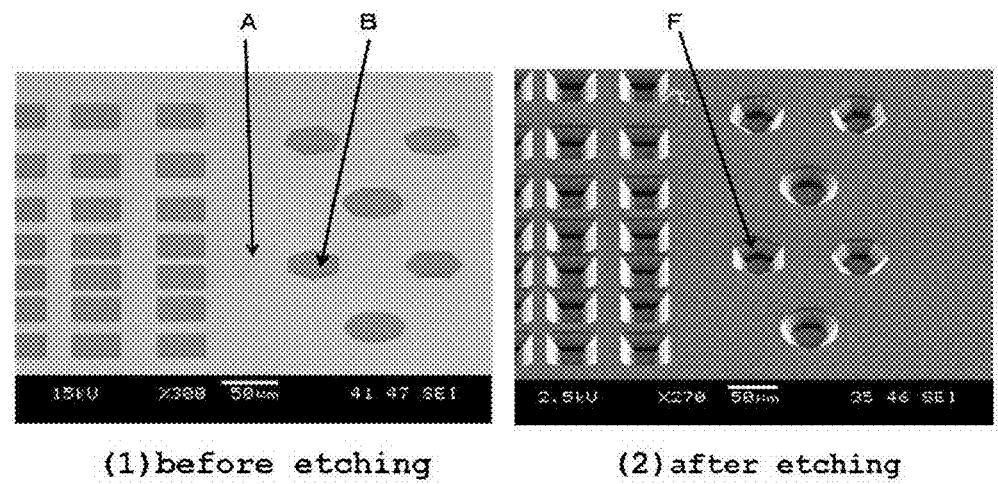
FIG. 43 illustrates SEM images of trench shapes after thermal etching according to an eighth embodiment.

FIG. 43 shows SEM images before and after thermal etching is applied to the basal plane of 6H-SiC having a hexagonal crystal structure.

FIG. 43(1) shows a state before thermal etching, that is, a state where a mask of an oxide film ($SiO_2$) is formed on the surface of the (000-1) plane being a basal plane of 6H-SiC having a hexagonal crystal structure. The portion A in the drawing is the oxide film ($SiO_2$) masked region, and the portion B in dark gray is a region in which the 6H-SiC face is exposed.

FIG. 43(2) shows an SEM image of a trench shape after thermal etching. At the portion masked with an oxide film, the substrate surface of the (000-1) plane of 6H-SiC appears. From the SEM image of FIG. 43(2), it is found that trench sidewalls (6 surfaces) tilted at approximately 55 degrees from the (000-1) plane of 6H-SiC having a hexagonal crystal structure were formed with excellent reproducibility by etching (refer to the slope of the portion F in FIG. 43(2)).

In FIG. 43(2), the black and white contrast occurring inside the tilted trench sidewalls (6 surfaces) formed by etching is caused by the use of the substrate including a lamination of 6H-SiCs different in conductivity. The SiC sample used for etching is in the middle of manufacturing of a MOSFET device, and in the SEM image after etching of FIG. 43(2), p-type 6H-SiC (white region) and n-type 6H-SiC (black region) are observed on the tilted surfaces of trench sidewalls.

Embodiment 9

The present ninth embodiment shows a result of obtaining of trench sidewalls (6 surfaces) tilted at approximately 55 degrees by forming a trench from the (000-1) plane being a basal plane of 15R-SiC having a rhombohedral crystal structure.

Figure 44:
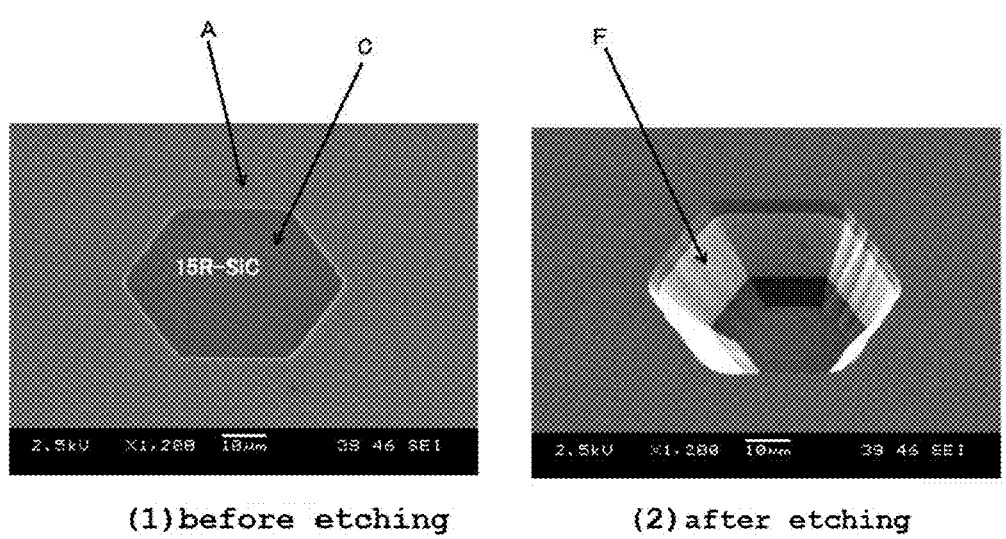
FIG. 44 illustrates SEM images of trench shapes after thermal etching according to a ninth embodiment.

FIG. 44 shows SEM images before and after thermal etching is applied to the basal plane of 15R-SiC having a rhombohedral crystal structure.

FIG. 44(1) shows a state before thermal etching, that is, a state where a mask of an oxide film ($SiO_2$) is formed on the surface of the (000-1) plane being a basal plane of 15R-SiC. The portion A in the drawing is the oxide film ($SiO_2$) masked region, and the portion C in dark gray is a region in which the 15R-SiC face is exposed.

FIG. 44(2) shows an SEM image of a trench shape after thermal etching. At the portion masked with an oxide film, the substrate surface of the (000-1) plane of 15R-SiC appears. From the SEM image of FIG. 44(2), it is found that the trench sidewalls (6 surfaces) tilted at 55 degrees from the (000-1) plane of 15R-SiC were formed with excellent reproducibility by etching (refer to the slope of the portion F in FIG. 44(2)).

In FIG. 44(2), the black and white contrast occurring inside the tilted trench sidewalls (6 surfaces) formed by etching is caused by the use of the substrate including a lamination of 15H-SiCs different in conductivity. The SiC sample used for etching is in the middle of manufacturing of a MOSFET device, and in the SEM image after etching of FIG. 43(2), p-type 15H-SiC (white region) and n-type 15H-SiC (black region) are observed on the tilted surfaces of trench sidewalls.

Other Embodiments

In the embodiments described above, 4H-SiC and 6H-SiC being hexagonal crystal systems and 15R-SiC being a rhombohedral crystal system are described, and regarding 3H-SiC being a cubic crystal system, it can also be supposed that in the same manner as 4H-SiC and 6H-SiC, trench sidewalls tilted at approximately 55 degrees are obtained by forming a trench from the (001) basal plane.

INDUSTRIAL APPLICABILITY

The present invention is useful for MIS (MOS) type field effect transistors to be used in inverter switches for electric vehicles, hybrid vehicles, rail vehicles, home appliances, and power systems, etc. The present invention is also applicable to insulated gate type bipolar transistors (IGBT).

DESCRIPTION OF SYMBOLS

10 Gate oxide film
20 Trench
22 Trench bottom surface
24 Sub-trench
26 Rough surface

What is claimed is:

1. An SiC semiconductor device, wherein
trench sidewalls are formed from a basal plane of SiC having a crystal structure of any of a hexagonal crystal, a cubical crystal, and a rhombohedral crystal or formed from an off plane having an off angle of 8 degrees or less with respect to the basal plane,
50% or more of the area of the trench sidewall is a plane tilted at 54 to 55 degrees from the basal plane, and
surfaces of the trench sidewalls are used as channel portions.

2. The SiC semiconductor device according to claim 1, wherein
the SiC is a hexagonal crystal,
the basal plane is a (0001) plane, and
the surface of the trench sidewall to be used as a channel portion is a {03-38} plane or a plane having an off angle of −8 to 8 degrees in a <1-100> direction with respect to the {03-38} plane.

3. The SiC semiconductor device according to claim 1, wherein
the SiC is a hexagonal crystal,
the basal plane is a (000-1) plane, and
the surface of the trench sidewall to be used as a channel portion is a {03-3-8} plane or a plane having an off angle of −8 to 8 degrees in a <1-100> direction with respect to the {03-3-8} plane.

4. The SiC semiconductor device according to claim 1, wherein 90% or more of the area of the trench sidewall is a plane tilted at 54 to 55 degrees from the basal plane.

5. The SiC semiconductor device according to claim 1, wherein the surface of the trench sidewall is formed into a plane tilted at 54 to 55 degrees from the basal plane by applying heat treatment to the trench.

6. The SiC semiconductor device according to claim 5, wherein the heat treatment is etching to be applied under any of the following conditions 1) to 3) under an atmospheric pressure or reduced pressure by using an inert gas including nitrogen or a noble gas or a hydrogen gas as a carrier gas:
   1) In a halogen-based gas atmosphere at a predetermined temperature;
   2) In a chlorine atmosphere or chlorine-oxygen mixed atmosphere at 800° C. or higher; or
   3) In a fluorine atmosphere at 400° C. or higher.

7. The SiC semiconductor device according to claim 5, wherein the heat treatment uses molten salt as a treatment agent.

8. The SiC semiconductor device according to claim 1, wherein the structure of the trench has a shape of any of an inverted hexagonal truncated pyramid, an inverted equilateral triangular truncated pyramid, an inverted hexagonal pyramid, and an inverted equilateral triangular pyramid all inner angles of which are 120 degrees.

9. The SiC semiconductor device according to claim 1, wherein the structure of the trench has a shape of either of an inverted quadrangular truncated pyramid or an inverted quadrangular pyramid of a parallelogram or a rhombus with inner angles of 60 degrees and 120 degrees.

10. The SiC semiconductor device according to claim 8, comprising a plurality of trenches forming a honeycomb structure.

11. The SiC semiconductor device according to claim 2, wherein the structure of the trench is formed to extend in the horizontal direction of the (0001) plane or an off plane having an off angle of 8 degrees or less with respect to the (0001) plane, each of sidewalls on both sides is formed of at least two kinds of different crystal planes selected from the {03-38} planes, and the upper edges of the trench sidewalls adjacent to each other are formed continuously so that the inner angle between the upper edges of the trench sidewalls is any of 60 degrees, 120 degrees, 240 degrees, and 300 degrees.

12. The SiC semiconductor device according to claim 3, wherein the structure of the trench is formed to extend in the horizontal direction of the (000-1) plane or an off plane having an off angle of 8 degrees or less with respect to the (000-1) plane, each of sidewalls on both sides is formed of at least two kinds of different crystal planes selected from the {03-3-8} planes, and the upper edges of the trench sidewalls adjacent to each other are formed continuously so that the inner angle between the upper edges of the trench sidewalls is any of 60 degrees, 120 degrees, 240 degrees, and 300 degrees.

13. The SiC semiconductor device according to claim 1, being a MOSFET with a trench type MOS gate structure.

14. The SiC semiconductor device according to claim 5, wherein
   the SiC is a hexagonal crystal,
   the basal plane is a (000-1) plane, and
   the surface of the trench sidewall to be used as a channel portion is a {03-3-8} plane or a plane having an off angle of −8 to 8 degrees in a <1-100> direction with respect to the {03-3-8} plane.

15. A method for manufacturing an SiC semiconductor device, comprising at least:
   a step of forming a trench structure in advance from a basal plane of SiC having a crystal structure of any of a hexagonal crystal, a cubical crystal, and a rhombohedral crystal or from an off plane having an off angle of 8 degrees or less with respect to the basal plane; and
   a step of forming trench sidewalls forming channel portions into planes tilted at 54 to 55 degrees from the basal plane by applying heat treatment to the trench.

16. The method for forming an SiC semiconductor device according to claim 15, wherein
   the SiC is a hexagonal crystal,
   the basal plane is a (0001) plane, and
   the method for forming an SiC semiconductor device comprising at least:
   a step of forming a trench structure in advance from the (0001) plane of SiC or an off plane having an off angle of 8 degrees or less with respect to the (0001) plane; and
   a step of forming trench sidewalls forming channel portions into {03-38} planes or planes having an off angle of −8 to 8 degrees in a <1-100> direction with respect to the {03-38} planes by applying heat treatment to the trench.

17. The method for forming an SiC semiconductor device according to claim 15, wherein
   the SiC is a hexagonal crystal,
   the basal plane is a (000-1) plane, and
   the method for forming an SiC semiconductor device comprising at least:
   a step of forming a trench structure in advance from the (000-1) plane of SiC or an off plane having an off angle of 8 degrees or less with respect to the (000-1) plane; and
   a step of forming trench sidewalls forming channel portions into {03-3-8} planes or planes having an off angle of −8 to 8 degrees in a <1-100> direction with respect to the {03-3-8} planes by applying heat treatment to the trench.

18. The method for forming an SiC semiconductor device according to claim 15, wherein the heat treatment is etching to be applied under any of the following conditions 1) to 3) under an atmospheric pressure or reduced pressure by using an inert gas including nitrogen or a noble gas or a hydrogen gas as a carrier gas:
   1) In a halogen-based gas atmosphere at a predetermined temperature;
   2) In a chlorine atmosphere or chlorine-oxygen mixed atmosphere at 800° C. or higher; or
   3) In a fluorine atmosphere at 400° C. or higher.

19. The method for forming an SiC semiconductor device according to claim 15, wherein the heat treatment uses molten salt as a treatment agent.

20. The SiC semiconductor device according to claim 2, comprising a trench sidewall formed into a plane tilted from the basal plane by a heat treatment etching applied under any of the following conditions 1) to 3) under an atmospheric pressure or reduced pressure by using an inert gas including nitrogen or a noble gas or a hydrogen gas as a carrier gas:
   1) In a halogen-based gas atmosphere at a predetermined temperature;
   2) In a chlorine atmosphere or chlorine-oxygen mixed atmosphere at 800° C. or higher; or
   3) In a fluorine atmosphere at 400° C. or higher.

21. The SiC semiconductor device according to claim 20, wherein 90% or more of the area of the trench sidewall is a plane tilted at 54 to 55 degrees from the basal plane.

* * * * *